(12) United States Patent  
Komino

(10) Patent No.: US 6,634,845 B1
(45) Date of Patent: Oct. 21, 2003

(54) TRANSFER MODULE AND CLUSTER SYSTEM FOR SEMICONDUCTOR MANUFACTURING PROCESS

(75) Inventor: Mitsuaki Komino, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 54 days.

(21) Appl. No.: 09/595,930

(22) Filed: Jun. 16, 2000

(30) Foreign Application Priority Data

Jun. 18, 1999 (JP) .......................................... 11-173318

(51) Int. Cl.[7] .............................................. B65G 49/05
(52) U.S. Cl. .................................... 414/217; 414/222.01
(58) Field of Search ............................... 414/935–941, 414/917, 922, 217, 222.13, 222.01

(56) References Cited

U.S. PATENT DOCUMENTS

| 4,624,617 A | * 11/1986 | Belna ......................... 414/347 |
| 4,742,286 A | 5/1988 | Phillips |
| 4,790,258 A | * 12/1988 | Drage et al. ................. 118/500 |
| 4,836,733 A | * 6/1989 | Hertel et al. ................. 414/225 |
| 4,917,556 A | * 4/1990 | Stark et al. .................. 414/217 |
| 5,202,716 A | * 4/1993 | Tateyama et al. ............. 354/319 |
| 5,288,379 A | * 2/1994 | Namiki et al. ......... 204/192.12 |
| 5,417,537 A | * 5/1995 | Miller ......................... 414/217 |
| 5,447,409 A | * 9/1995 | Grunes et al. ............ 414/744.6 |
| 5,554,914 A | 9/1996 | Miyazawa |
| 5,709,291 A | 1/1998 | Nishino et al. |
| 5,793,184 A | 8/1998 | O'Connor |
| 6,008,622 A | 12/1999 | Nakawatase |
| 6,285,102 B1 | 9/2001 | Matsuoka et al. |

FOREIGN PATENT DOCUMENTS

| JP | 60-162731 | 10/1985 |
| JP | 62-88528 | 4/1987 |
| JP | 6-49529 | 6/1994 |
| JP | 10-275848 | 10/1998 |

* cited by examiner

Primary Examiner—Eileen D. Lillis
Assistant Examiner—Charles A. Fox
(74) Attorney, Agent, or Firm—Pillsbury Winthrop LLP

(57) ABSTRACT

A number of process chambers connected to a transfer module can be increased after a cluster system provided with the transfer module is initially established. The transfer module transfers an object to be processed between a transfer chamber and at least one process chamber connected to the transfer chamber. A housing of the transfer module defines the transfer chamber, the housing having a substantially rectangular cross section so that a plurality of the housings are connectable to each other. A movable part is provided in the transfer chamber, the movable part being movable along a base surface provided in the housing of the transfer module. A transfer part is provided on the movable part, the transfer part holding the object to be processed and being movable between the transfer chamber and the process chamber. A drive mechanism drives the movable part, and a control unit controls motion of the movable part.

20 Claims, 14 Drawing Sheets

TRANSFER MODULE AND CLUSTER SYSTEM FOR SEMICONDUCTOR MANUFACTURING PROCESS

BACKGROUND OF THE INVENTION

1. Field of the Invention

The present invention relates to a transfer module and a cluster system and, more particularly, to a transfer module which can be used in a cluster system provided with a plurality of process apparatuses.

Typically, the cluster system refers to a multi-chamber manufacturing apparatus which comprises a transfer module and a plurality of process modules arranged around the transfer module.

2. Description of the Related Art

In recent years, demand for the cluster system has been increased, which cluster system can consecutively perform a plurality of processes for manufacturing a liquid crystal display (LCD), a plasma display or a semiconductor device. For example, Japanese Laid-Open Patent Application No. 10-275848 discloses a transfer module comprising an octagonal housing defining a transfer chamber and a transfer apparatus rotatably provided in the octagonal housing. A process module can be mounted to each side of the octagonal housing. The transfer apparatus takes an object to be processed such as a wafer out of a load lock cassette or a load lock chamber, and transfers the object to the process chamber of the process module. The object processed in the process chamber is taken out of the process chamber by the transfer apparatus, and transferred to another process module, the load lock module, or other modules. Generally, the transfer apparatus comprises a robot fixed in the housing in a rotatable state and a transfer arm for holding and transferring the object to be processed.

The above-mentioned conventional cluster system has some problems in relation to the transfer module. That is, the maximum number of process module that can be connected to the transfer module is limited by the shape of the housing of the transfer module. A polygonal shape such as an octagon has been adopted for the housing of the transfer module, which provides less freedom of selection and makes the housing difficult to be produced.

Accordingly, in the conventional cluster system, it is difficult to increase the number of process modules to be connected to the transfer module after the cluster system is initially established since the number of process modules that can be connected to the transfer module is limited by the shape of the housing of the transfer module. Thus, the conventional cluster system is not suitable for stepwise investment to the manufacturing facility. Additionally, the shape of the housing of the transfer module having a polygonal shape is less economic due to the difficulty in producing the housing.

Additionally, the configuration of the conventional cluster system is less efficient with respect to an area occupied by the cluster system since the process modules are arranged in the periphery of the transfer module. It should be noted that the area needed for installing the cluster system is referred to as "foot print" or "face print".

Further, the number of process modules to which a single transfer module can transfer the object to be processed is limited by the shape of the transfer module. That is, since the transfer apparatus, such as a robot, is fixed within the transfer module, the number of process modules to which the transfer module can access is limited to the number of sides of the transfer module housing having a polygonal shape. Accordingly, if a new cluster system is installed near an existing cluster system, the transfer apparatus or either the existing cluster system or the added cluster system cannot transfer an object to be processed between the new cluster system and the existing cluster system.

SUMMARY OF THE INVENTION

It is a general object of the present invention to provide an improved and useful transfer module and cluster system in which the above-mentioned problems are eliminated.

A more specific object of the present invention is to provide a transfer module to which an arbitrary number of process chambers can be connected so that the number of process chambers which can be connected to the transfer module can be increased after the cluster system provided with the transfer module is initially established.

Another object of the present invention is to provide a cluster system in which the number of process chambers provided therein can be increased without limitation due to the shape of the transfer module housing.

In order to achieve the above-mentioned objects, there is provided according to one aspect of the present invention a transfer module for transferring an object to be processed between a transfer chamber and at least one process chamber connected to the transfer chamber, the transfer module comprising:

a housing defining the transfer chamber, the housing having a substantially rectangular cross section so that a plurality of the housings are connectable to each other;

a movable part provided in the transfer chamber, the movable part being movable along a base surface provided in the housing;

a transfer part provided on the movable part, the transfer part holding the object to be processed and being movable between the transfer chamber and the process chamber;

a drive mechanism driving the movable part; and a control unit controlling motion of the movable part.

According to the above-mentioned invention, the housing of the transfer module has a substantially rectangular parallelepiped shape which facilitates the production thereof. The rectangular parallelepiped shape of the housing also facilitates, combination of a plurality of the housings. That is, the transfer module can be constituted by a plurality of the housings, and the movable part can move over the plurality of the housing. Thus, the transfer part can easily access each of the process chambers connected to the transfer chamber defined by the plurality of housings.

Additionally, there is provided according to another aspect of the present invention a cluster system comprising:

at least one process module defining a process chamber, the process module applying a predetermined process to an object to be processed in the process chamber;

at least one load lock module defining a load lock chamber, the load lock module having a substantially rectangular cross section; and a transfer module defining a transfer chamber, the transfer module transferring the object between the transfer chamber and each of the process chamber and the load lock chamber, wherein the transfer module comprises:

a housing defining the transfer chamber, the housing having a substantially rectangular cross section so that a plurality of the housings are connectable to each other;

a movable part provided in the transfer chamber, the movable part being movable along a base surface provided in the housing;

a transfer part provided on the movable part, the transfer part holding the object to be processed and being movable between the transfer chamber and the process chamber;

a drive mechanism driving the movable part; and a control unit controlling motion of the movable part.

According to the above-mentioned invention, the transfer module can be constituted by a plurality of housings, which increases the number of process modules connectable to the transfer module. Additionally, the movable part can move over the transfer chamber constituted by the plurality of housings, thereby enabling one transfer part to access each of the process modules connected to the transfer module.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of a first embodiment of the present invention.

Figure 1:
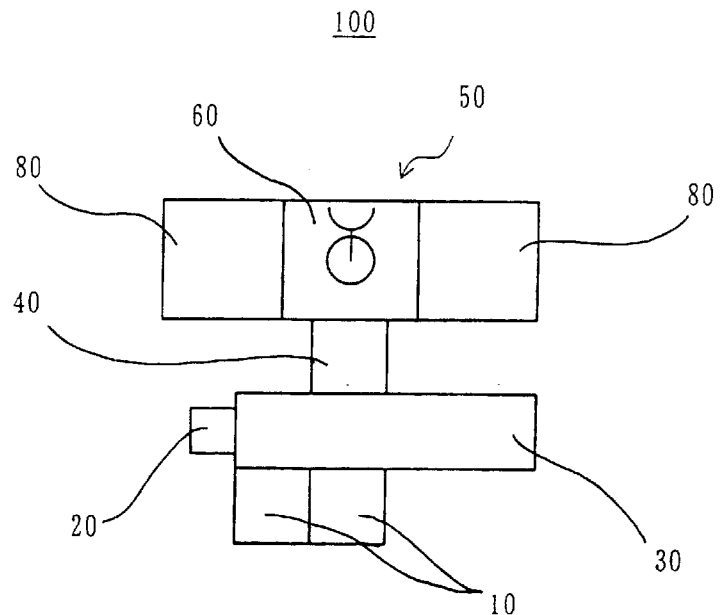
FIG. 1 is an illustration of a cluster system according to a first embodiment of the present invention.
Figure 2:
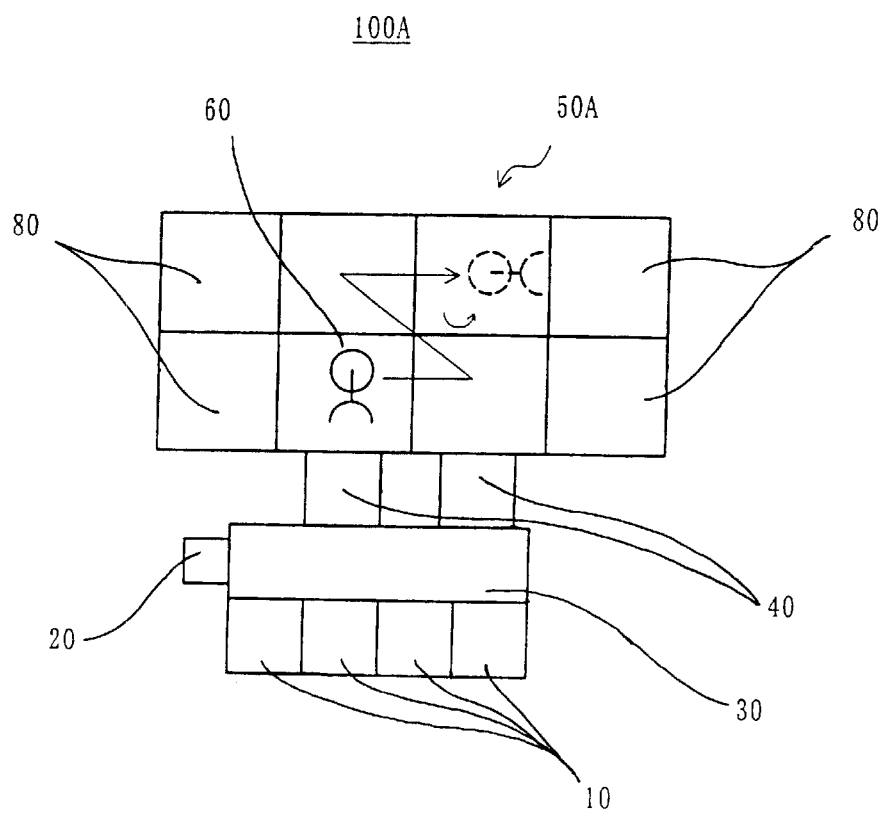
FIG. 2 is an illustration of the cluster system shown in FIG. 1 after being expanded.

FIG. 1 is an illustration of a cluster system 100 according to the first embodiment of the present invention. FIG. 2 is an illustration of a cluster system 100A established by expanding the cluster system 100 shown in FIG. 1.

Referring to FIG. 1, the cluster system (may be referred to as a cluster tool) 100 comprises two load ports 10, an orienter 20, a loader module 30, a load lock module 40, a transfer module 50 and two process modules 80. It should be noted that the number of load lock modules and the number of process modules can be changed to desired numbers, respectively.

In the present embodiment, the load port 10 accommodates an ME pod such as a front opened unified pod. However, any other wafer carries such as a bottom opened unified pod or an open cassette may be used. The ME pod is automatically transferred by a transfer apparatus such as an automated guided vehicle (AGV) or an overhead hoist transfer (OHT), and is attached to the load port 10. Each ME pod accommodates a plurality of wafers as objects to be processed. There is a large demand for such an automated transfer of the carrier (the ME pod or the cassette) as a substitution for the conventional manual transfer due to increase in the size and weight of a wafer (for example, 300 mm wafer). It should be noted that the object to be processed which is handled by the cluster system 100 is not limited to a wafer, and any desired object such as an LCD glass substrate may be transferred.

Generally, the AGV is mechanically engaged with a transfer rail, and moves while being guided by the transfer rail. In this application, a track of a guided moving member such as the AGV is referred to as "definite track". On the other hand, a track of a guided moving member of which movement is not fixed by being engaged with a guiding member is referred to as "indefinite track". The AGV and the OHT are well known in the art, and the structures and operations thereof will be omitted.

The orienter 20 serves to accurately position a wafer by adjusting an orientation flat (a strait portion formed by cutting a circle) or a notch provided to the wafer accommodated in the ME pod. The orienter 20 may use a mechanical means, an optical means or an ultrasonic means. As for the mechanical means, there is a mechanism performing the positioning by pressing a plurality of pins against the periphery and the orientation flat of the wafer. Also, there is a roller mechanism which allows a rotation of the wafer when the periphery of the wafer contact the roller and stops the rotation of the wafer when the orientation flat is brought into contact with the roller. As for the optical means, there is an arrangement that detects the orientation flat by a transmission type optical sensor comprising a light emitting element and a receiving light receiving element. As for the ultrasonic means, there is an arrangement that detects the orientation flat of the wafer by a reflection type ultrasonic sensor.

Conventionally, the mechanism of an orienter is entirely or partially accommodated in the load lock module 30 or the transfer module 50. Such an arrangement may cause a destruction of a vacuum or negative pressure environment of the load lock module 30 or the transfer module 50. Additionally, such an arrangement may increase complexity of the structure of the transfer module, which may increase a cost of the cluster system. However, according to the cluster system according to the present embodiment, the configuration of the load lock module 30 or the transfer module 50 can be simplified since the orienter 20 is located outside the transfer chamber, which contributes to the reduction in the cost of the cluster system 100.

The loader module 30 is a transfer module operated under an atmospheric pressure environment. The load module 30 receives the wafer, and transfers the wafer to the load lock module 40 and also takes the wafer out of the load lock module 40.

The load lock module 40 defines a vacuum chamber (load lock chamber), which enables transfer of the wafer without opening the process chamber of the process module 80 to an atmospheric pressure environment. The load lock module is connected to a vacuum pump (not shown in the figure). The load lock module 40 may be provided with a preheating means and/or a precooling means. In the system shown in FIG. 2, one of the two load lock modules may be provided with the preheating means and the other one of the load lock modules may be provided with the precooling means. The preheating means may include a heater, such as a lamp heater, so as to heat a wafer to a temperature close to the process temperature before the wafer is introduced into one of the process modules 80. The precooling means may include a cooling chamber cooled by a coolant so as to cool a wafer taken out of one of the process modules 80 to a normal temperature before the wafer is transferred to the subsequent process apparatus, such as an ion implantation apparatus or an etching apparatus. In the present embodiment, the load lock module 40 can be configured in a rectangular shape, which facilitates fabrication of the load lock module 40 and reduces the production cost of the cluster system.

Figure 3:
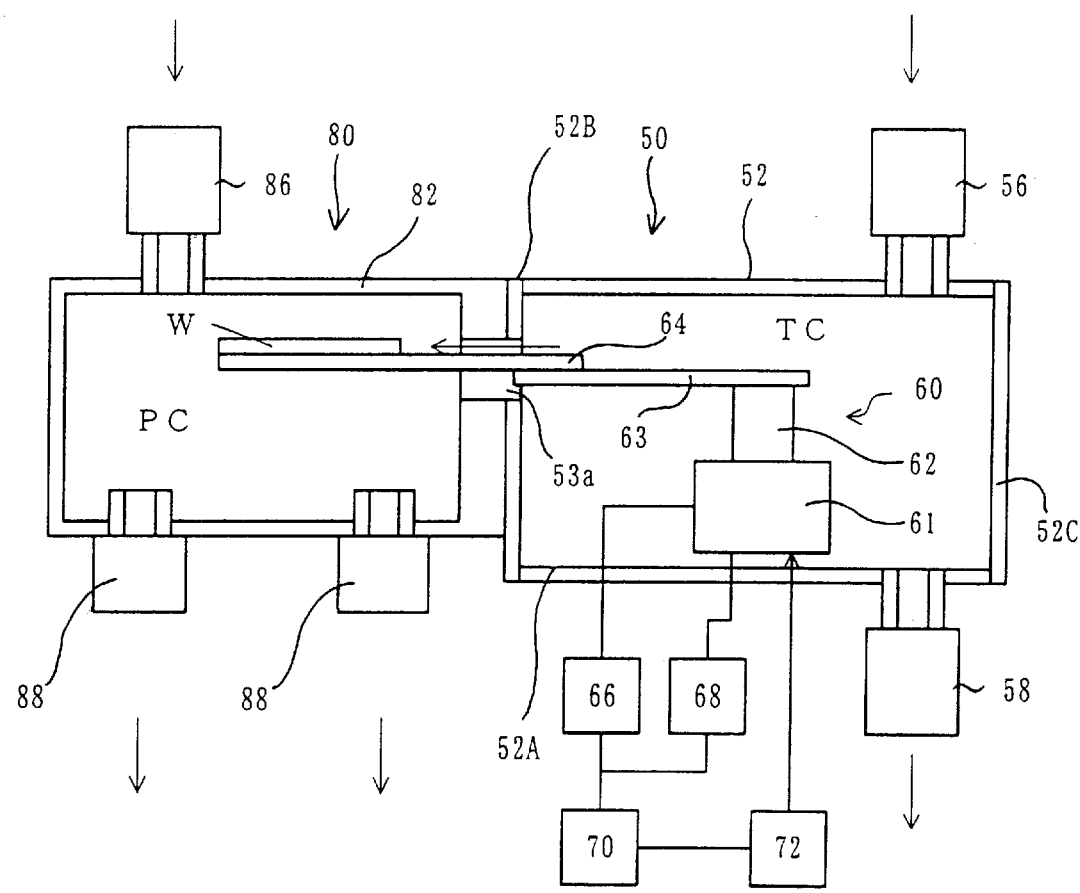
FIG. 3 is an illustration of a transfer module and a process modules shown in FIG. 1.

FIG. 3 is an illustration of the transfer module 50 and one of the process modules 80 shown in FIG. 1. In FIG. 3, the other one of the process chambers 80 shown in FIG. 1 is omitted for the sake of simplification of the figure. Referring to FIGS. 1 and 3, the transfer module 50 comprises a housing 52, which defines a transfer chamber TC. The housing 52 has a generally rectangular cross section, and is connected to a gas supply apparatus 56 and a gas exhaust apparatus 58. A transfer apparatus 60 is accommodated in the transfer chamber TC. The transfer chamber TC can be maintained at a negative pressure or vacuum by the operations of the gas supply apparatus 56 and the gas exhaust apparatus 58.

The transfer apparatus 60 accommodated in the transfer chamber TC comprises a robot 61, a connecting portion 62, a transfer arm 63 and an end effecter 64. The connecting portion 62, the transfer arm 63 and the end effecter 64 constitute a transfer part as described later. In FIG. 3, the robot 61 is accommodated in the transfer chamber TC. The robot 61 is movable on a bottom surface 52A of the transfer chamber TC in a noncontact state. That is, the robot 61 can rotate and/or move parallel to the bottom surface 52A in a noncontact state. The mode of movement of the robot 61 is changed according to a system to which the robot 61 is applied such as a radial chamber system or an inline chamber system.

The connecting portion 62 comprises a rod member connecting the transfer arm 63 to the robot 61. The length of the connecting portion 62 may be fixed, or the connecting portion may be configured to be projected and retracted. Additionally, the connecting portion 62 can be rotatable or unrotatable with respect to the robot 61. Alternatively, the connecting portion may be omitted, and the transfer arm 63 may be directly connected to the robot 61. The end effecter 64 is connected to the transfer arm 63 so as to hold and transfer the wafer W to a process chamber PC defined in the process module 80.

The transfer part comprised of the connecting portion 62, the transfer arm 63 and the end effecter 64 has many variations.

Figure 4:
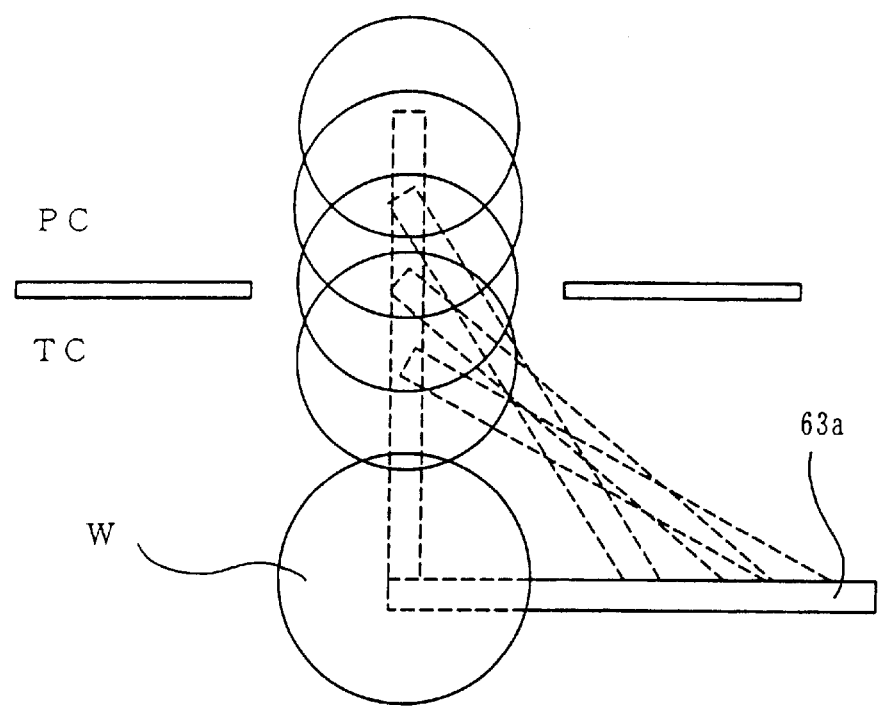
FIG. 4 is a plan view of a non-articulated arm which is applicable to the transfer arm shown in FIG. 3.

For example, the transfer arm 63 and the end effecter 64 can be configured as a single pick non-articulate type transfer arm 63a as shown in FIG. 4. The transfer arm 63a shown in FIG. 4 holds the semiconductor wafer W on one end thereof. The opposite end of the transfer arm 63a is unrotatably connected to the connecting portion 62. In order to transfer the wafer W to the process chamber PC, the robot 61 must be synchronously rotated with the transverse movement of the robot 61.

Figure 5:
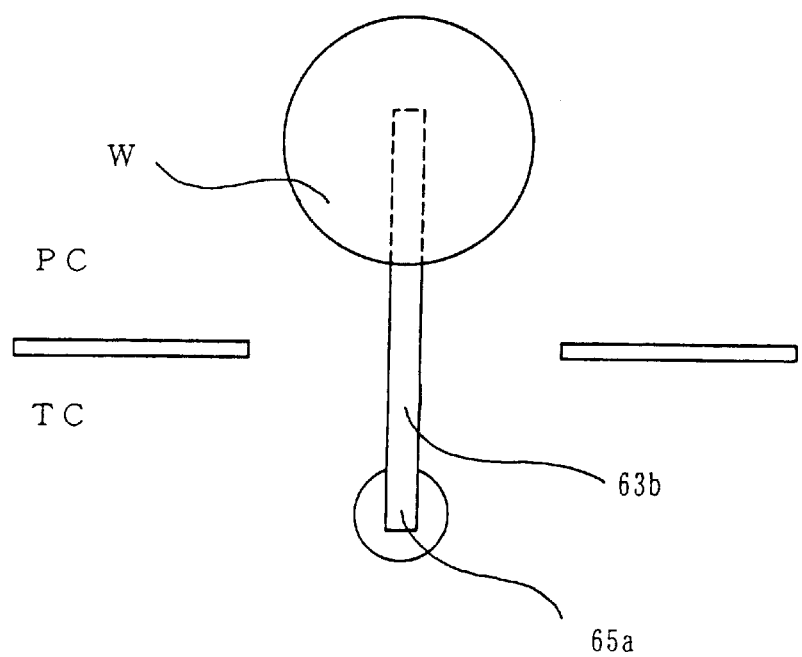
FIG. 5 is a plan view of an articulated arm which is applicable to the transfer arm shown in FIG. 3.

Alternatively, the transfer arm 63 and the end effecter 64 can be configured as a single articulated arm 63b having an articulation 65a as shown in FIG. 5. The transfer arm 63b shown in FIG. 4 holds the semiconductor wafer W on one end thereof. The opposite end of the transfer arm 63b is rotatably connected to the connecting portion 62. In order to transfer the wafer W to the process chamber PC, the transfer arm is rotated about the connecting portion 62 and the robot 61 is moved toward the process chamber PC.

Figure 6:
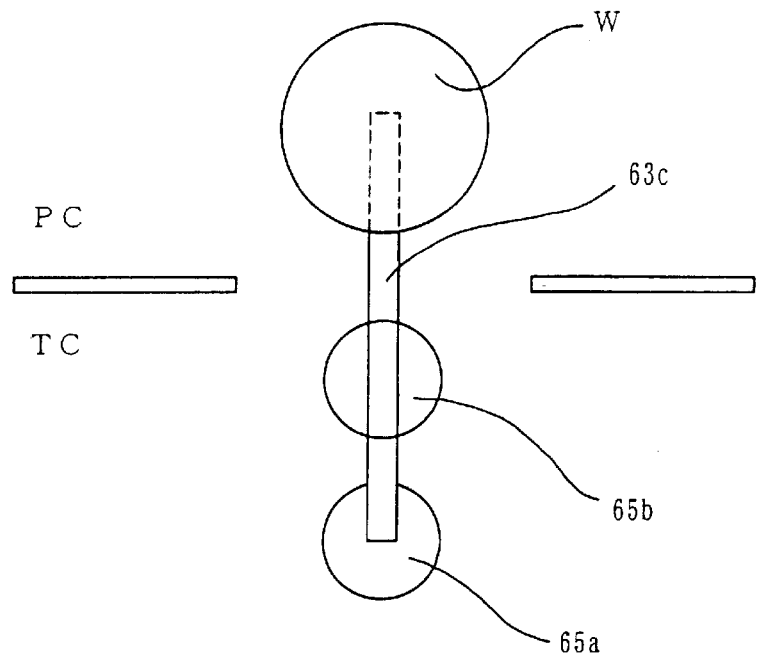
FIG. 6 is a plan view of another articulated arm which is applicable to the transfer arm shown in FIG. 3.

Further alternatively, the transfer arm 63 and the end effecter 64 can be configured as a transfer arm 63c having articulations 65a and 65b as shown in FIG. 6. The transfer arm 63c shown in FIG. 6 can be pivoted about the articulation 65a or 65b, respectively.

Figure 7:
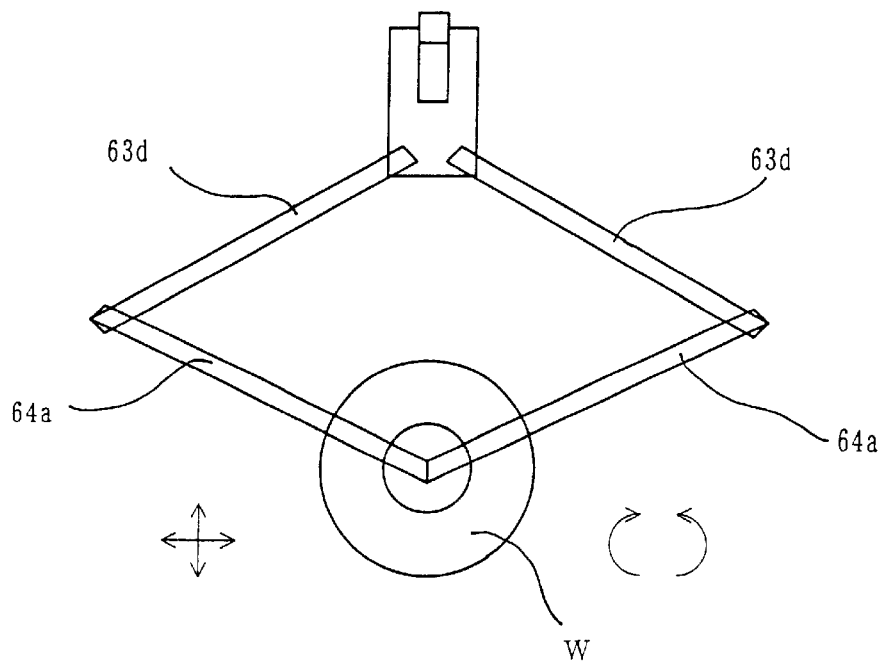
FIG. 7 is a plan view of a single pick frog leg arm.
Figure 8:
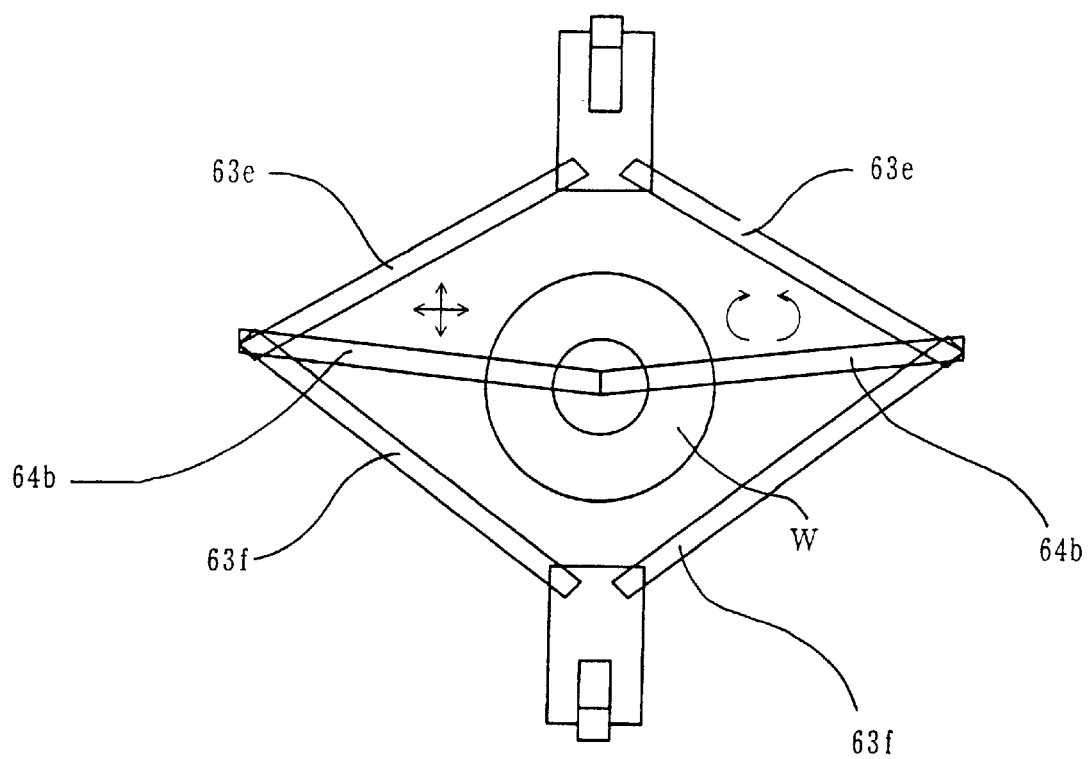
FIG. 8 is a plan view of a twin pick frog leg arm.

Additionally, the transfer arm 63 and the end effecter 64 can be configured as a single pick frog leg type arm comprising a pair of transfer arms 63d and a pair of end effecters 64d as shown in FIG. 7, or a twin pick frog leg arm comprising a pair of transfer arms 63e, a pair of transfer arms 63f and a pair of end effecters 64b as shown in FIG. 8.

Returning to FIG. 3, the transfer apparatus 60 further comprises a drive unit 66 for driving the robot 61, a floating mechanism 68 for floating the robot 61 above the bottom surface 52A and a control unit 70 for controlling the movement and the floating action of the robot 61. Preferably, the transfer apparatus 60 further has a floating amount detector 72 for detecting the amount of float of the robot 61 so that the control unit 70 feedback controls the drive unit 66 and the floating mechanism 68 based on the result of the detection by the floating amount detector 72.

Figure 9:
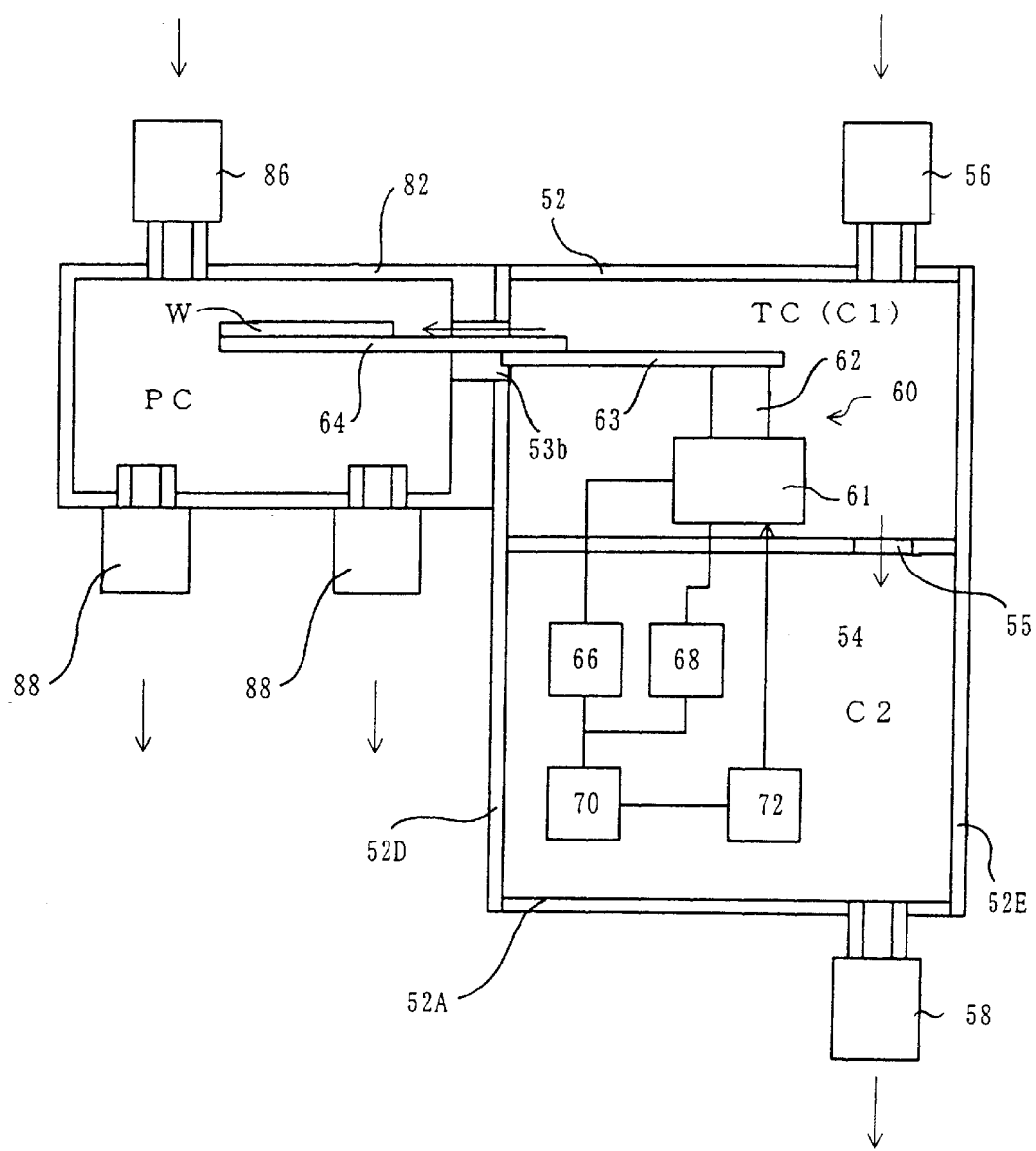
FIG. 9 is an illustration of a variation of the transfer module shown in FIG. 3.

FIG. 9 is an illustration of a variation of the transfer module shown in FIG. 3. As shown in FIG. 9, the drive unit 66, the floating mechanism 68, the control unit 70 and the floating amount detector 72 can be accommodated in the housing 52 in a space separated from the space in which the robot 61 and the transfer arm 63 are provided by a separation wall 54.

In the transfer module shown in FIG. 9, the floating mechanism 68 operates the robot 61 to float above the separation wall 54. The drive unit 66, the floating mechanism 68 and the control unit 70 may be provided in the robot 61. The drive unit 66 and the floating mechanism 68 may be unitized. It should be noted that the space C1 in which the robot 61 is accommodated can be maintained at a negative pressure, and the space C2 separated from the space C1 by the separation wall 54 can also be maintained at a negative pressure approximately equal to that of the space C1. In the present embodiment, the gas in the space C1 is evacuated through an opening 55 formed in the separation wall 54 and via the space 2. Accordingly, the volume of the space C1 which require a high level of cleanness can be reduced, and the cleanness of the space C1 can be easily managed by the simplification of the structure in the space C1.

The drive unit 66 can be constituted as a battery incorporated in the robot 61. Alternatively, the drive unit 66 may include a noncontact power supply unit. For example, the drive unit 66 may comprise a transmitting unit for transmitting a radio frequency from outside the transfer chamber TC and a power supply circuit and an antenna unit incorporated in the robot 61. In this case, the radio frequency transmitted from the transmitting unit is received by the antenna unit, and the power supply circuit generates an induced electromotive force by electromagnetic induction. Additionally, the drive unit 66 may be comprised of a light source (light emitting element) which transmits a light beam from the outside of the transfer chamber TC and a light receiving element and an optoelectric conversion circuit incorporated in the robot 61. Further, the noncontact power supply apparatus of the drive unit 66 can be achieved by providing a pair of transformers or coils in an opposing arrangement and providing a switching circuit to rectify a power supply current. The drive unit 66 can also be achieved by any other known techniques.

The cluster system 100 must perform an accurate positioning of the wafer W under a vacuum or a negative pressure environment. Accordingly, the robot 61 (moving part) must be accurately positioned within the transfer module. In a conventional cluster system, a smooth movement is achieved by ball bearings or roller bearings provided between the moving part and a surface on which the moving part is moved. The ball bearings or the roller bearings must be lubricated. Accordingly, when the ball bearings or the roller bearings are used under vacuum or negative pressure environment, a gas may be generated from the lubricant, which increases the pressure in the cluster system. Additionally, the lubricant may scatter due to rotation of balls or rollers. Further, a start response and a positional accuracy are not good due to friction. Additionally, there is a problem in that the wafer W cannot be transferred at a high speed since there is a vibration generated due to the friction. In order to eliminate the above-mentioned problems, in the present embodiment, the floating mechanism 68 renders the robot 61 to flat above the bottom surface 52A or the separation wall 54 or the transfer chamber TC.

The floating mechanism 68 can be achieved by using any known techniques such as magnetic floating, electrostatic floating, gas floating and a combination of aforementioned.

If the magnetic floating is used in the cluster system shown in FIG. 9, a pair of magnets having the same polarity are provided with the separation wall 54 interposed therebetween. One of the magnets is located on the bottom of the robot 61 and the other one of the magnets is provided in a magnetic drive unit (not shown in the figure) located on the opposite side of the separation wall 54 so that the pair of magnets repel each other. Accordingly, the robot 61 floats above the separation wall 54 due to a repulsion force between the magnets. Such a magnetic floating arrangement may be provided in the cluster system shown in FIG. 3.

If the electrostatic floating is used in the cluster system shown in FIG. 9, a pair of electrodes or dielectric members having the same polarity are provided with the separation wall 54 interposed therebetween. One of the electrodes or the dielectric members is located on the bottom of the robot 61 and the other one of the electrodes or dielectric members is provided in an electrostatic drive unit (not shown in the figure) located on the opposite side of the separation wall 54 so that the pair of electrodes or dielectric members repel each other. Accordingly, the robot 61 floats above the separation wall 54 due to a repulsion force between the electrodes or dielectric members. Such an electrostatic floating arrangement may be provided in the cluster system shown in FIG. 3.

If the gas floating is used in the cluster system shown in FIG. 9, an inert gas such as nitrogen, argon or neon is ejected from the robot 61 toward the separation wall 54 so that the robot 61 floats above the separation wall 54. Such a gas floating arrangement may be provided in the cluster system shown in FIG. 3.

It should be noted that the above-mentioned floating arrangements assist the achievement of the "indefinite track" by the robot 61. The above-mentioned floating arrangement is preferably used with a magnetic coupling or an electrostatic coupling so as to control an amount of floatation of the robot 61. That is, a pair of magnets having different polarities or a pair of electrodes having different polarities are provided so as to attract the robot 61 toward the separation wall 54 or the bottom surface 52A.

Japanese Patent Publication No. 6-49529 discloses a method using a magnetic floating mechanism to transfer an object within a vacuum chamber. According to the method, a work piece such as a wafer is mounted on a transfer arm that floats within the vacuum chamber by being supported by a magnetic force applied by electromagnets provided outside the vacuum chamber. The transfer arm transfers the work piece within the vacuum chamber. Accordingly, the transfer arm does not produce dust or particles within the vacuum chamber since the transfer arm can move within the vacuum chamber in the non-contact manner. However, said patent document does not disclose the floating mechanism of the transfer arm and the method for controlling the floatation of the transfer arm. For example, in the method disclosed in the above-mentioned Japanese Patent Publication No. 6-49529, there may be a case in which the lift of the transfer arm fluctuates and cannot be maintained at a constant level, or the transfer arm vibrates. Additionally, if the movable unit is lifted in excess, an appropriate drive control cannot be performed, and a high-speed motion and a quick response cannot be achieved.

Figure 10:
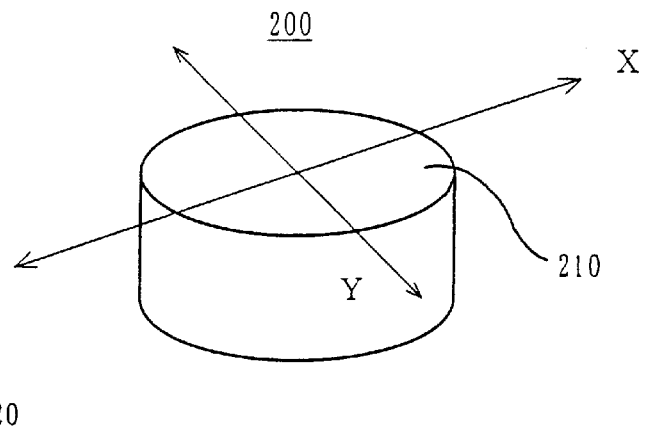
FIG. 10 is a perspective view of a gas bearing.
Figure 11:
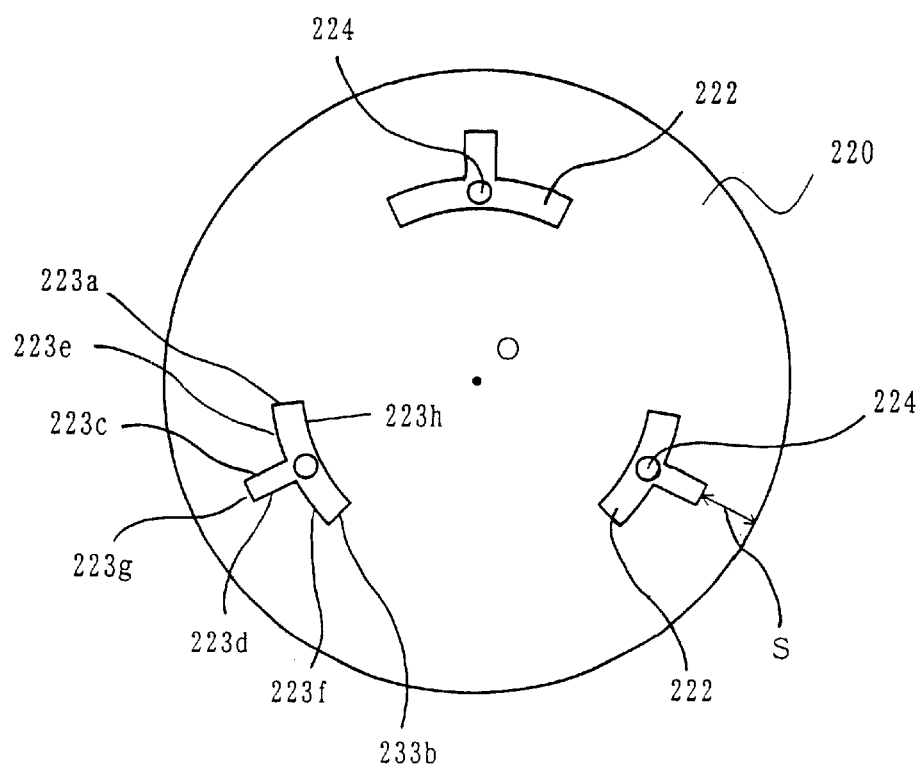
FIG. 11 is an enlarged plan view of the gas bearing shown in FIG. 10.
Figure 12:
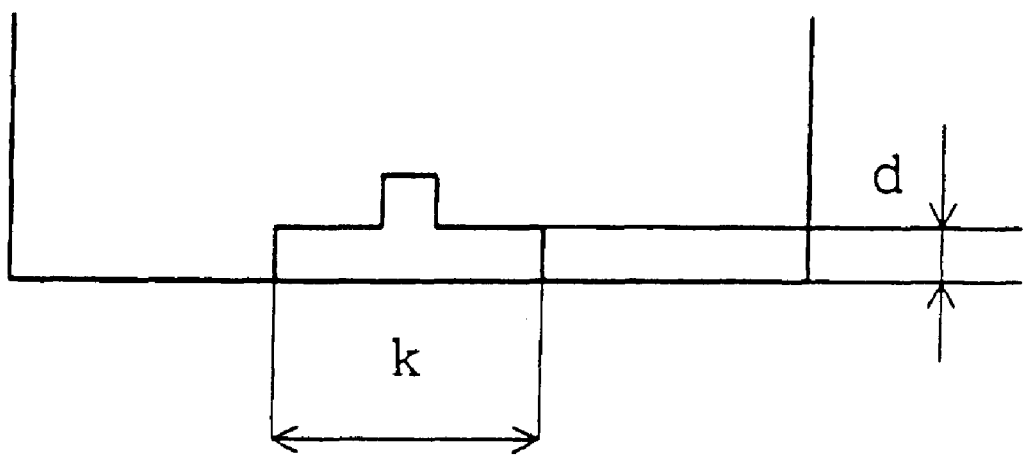
FIG. 12 is an enlarged cross-sectional view of a part of the gas bearing shown in FIG. 10.
Figure 13:
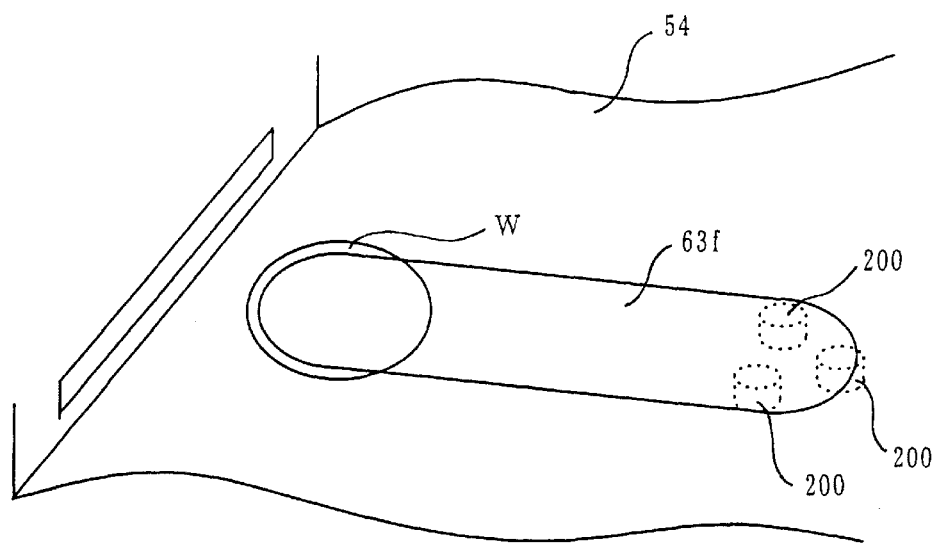
FIG. 13 is a perspective view of a transfer arm which corresponds to the transfer arm and the end effecter shown in FIG. 3 or FIG. 9 in a state in which a wafer and three gas bearings are mounted on the transfer arm.
Figure 14:
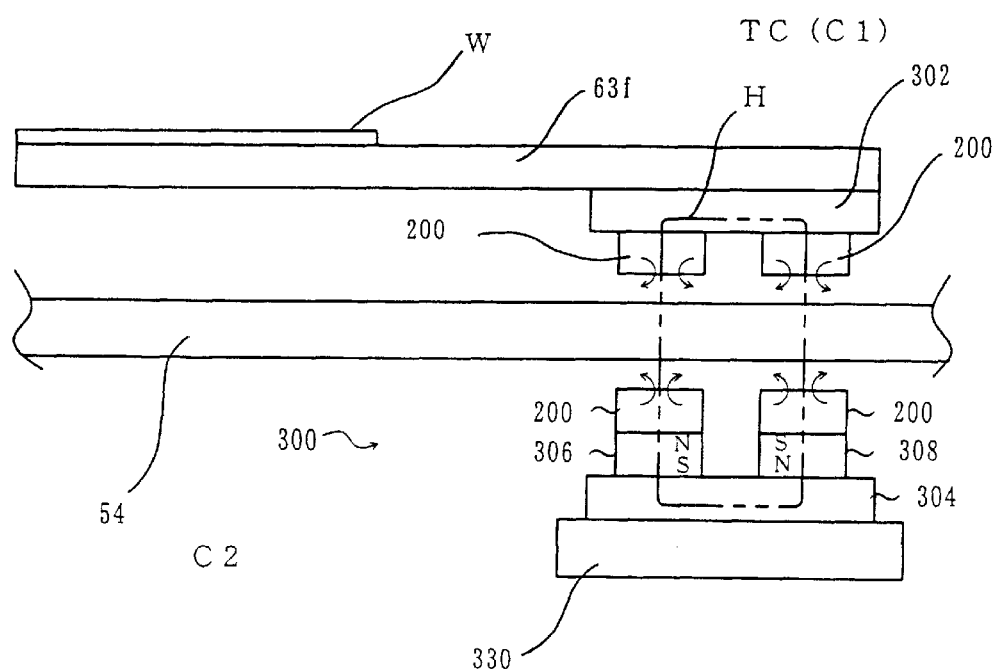
FIG. 14 is an enlarged cross-sectional view of a part of the transfer arm shown in FIG. 13.

In the present embodiment, the floating mechanism 68 comprises three gas bearings 200 shown in FIGS. 10 through 14. FIG. 10 is a perspective view of the gas bearing 200. FIG. 11 is an enlarged plan view of the gas bearing 200 shown in FIG. 10. FIG. 12 is an enlarged cross-sectional view of a part of the gas bearing 200 shown in FIG. 10. FIG. 13 is a perspective view of a transfer arm 63f which corresponds to the transfer arm 63 and the end effecter 64 shown in FIG. 3 or FIG. 9 in a state in which a wafer W and three gas bearings 200 are mounted on the transfer arm 63f. FIG. 14 is an enlarged cross-sectional view of a part of the transfer arm shown in FIG. 13. The floating mechanism 68 further comprises a magnetic circuit shown in FIG. 14. Accordingly, the robot 61 can float by the air bearings 200, and the amount of floatation is controlled by the magnetic coupling provided by the magnetic circuit. The robot 61 is driven by the drive unit 66 and the floating mechanism 68. The mode of movement of the robot 61 includes a rotational movement, a rectilinear movement (one-dimensional movement) and a two-dimensional movement.

Each gas bearing 200 located in the closed space C1 has a cylindrical shape having a top surface 210 and a bottom surface 220. The bottom surface 220 is immediately above the bottom surface or the upper surface (hereinafter referred to as an opposing surface OP) of the separation wall 54. The shape of the air bearing 200 is not limited to the cylindrical shape. The cylindrical shape is suitable for both the rotational motion and the two-dimensional movement of the transfer arm 100. If the rectilinear motion is needed, the air bearing 200 may be connected to a rail (not shown in the figure), which enables the rectilinear motion of the transfer arm 100.

It is preferable that the gas bearing 200 be formed in a symmetric shape so that the gas bearing 200 can float in a flat and stable position. It should be noted that a plurality of the gas bearings 200, for example, three gas bearings 200 may be provided to the transfer arm 100 as described later so as to support the transfer arm 100 in a preferred position.

Referring to FIGS. 3, 4 and 10–14, the gas bearing 200 ejects a gas between the robot 61 and the opposing surface OP so as to float the robot 61 above the opposing surface OP. Thereby, the robot 61 can smoothly slide along opposing surface OP. The gas bearing 200 can be integrally formed with the robot 61, or may be separated from each other. The gas bearing 200 builds a pressure between the robot 61 and the opposing surface OP so as to float the robot 61 above the opposing surface OP. Accordingly, the gas bearing 200 includes an opening 222 to supply a gas between the robot 61 and the opposing surface OP so as to form a narrow gap therebetween. The opening 222 can be in the form of an aperture or an orifice.

The gas bearing 200 can control the flow of the gas and a pressure of the gas alone or in association with other parts. The control of the flow of the gas is performed so as to prevent elimination of the negative pressure environment. The control of the flow of the gas is also performed to adjust a floating height of the robot 61 from the opposing surface OP. Alternatively, the flow control function can be achieved by using a part of the robot 61. Additionally, the control of the floating height of the robot 61 can be performed by the drive unit 66 alone or in association with the gas bearing 200. The control of the floating height of the robot 61 can be achieved by a mass flow controller which controls a flow of the gas. For example, the flow of the gas can be controlled by a combination of a floating amount detector 72 for detecting the amount of floatation of the robot 61 and a flow control apparatus (not shown in the figure) for controlling a flow of the gas.

The gas is not limited to air, and an inert gas such as nitrogen or argon may be used. The gas bearing 200 is connected to an external container, which stores the gas so that the gas is supplied from the external container to the gas bearing 200. An inert gas has an advantage that it does not contain oxygen, which can cause oxidation or combustion. The gas bearing 200 can be either a static pressure type or a dynamic pressure type. In the static pressure type gas bearing, the robot 61 floats above the opposing surface OP by the supply or introduction of the gas. In the dynamic pressure type gas bearing, the robot 61 floats above the opposing surface OP by a floating force generated by a flow stream of gas which flow stream is generated by a motion of the opposing surface OP. A typical example of the dynamic pressure type gas bearing can be seen in a hard disk drive in which a magnetic head floats on a hard disk by a floating force generated by an air stream generated by the rotation of the hard disk.

As shown in FIG. 11, the bottom surface 220 of the gas bearing 200 is provided with three T-shaped grooves 222 having the same configuration and size. Each of the T-shaped grooves 222 is defined by straight sides 223a, 223b, 223c and 223d; arc-like sides 223e and 223f which are parts of a first concentric circle of the circle defining the bottom surface 220 of the gas bearing 200 and having the center O; an arc-like side 223g which is a part of a second concentric circle of the circle defining the bottom surface 220; and an arc-like side 223h which is a part of a third concentric circle of the circle defining the bottom surface 220. As shown in FIG. 12, each of the T-shaped grooves 222 has a predetermined width k and a predetermined depth d. The shape of each of the grooves is not limited to the T-shape. However, it is preferable that the each of the grooves be formed in a symmetric shape with respect to a radius of the circle defining the bottom surface 220 so that the air bearing 200 is well balanced.

A gas inlet opening 224 is provided at the intersection of the grooves forming each of the T-shaped grooves 222. The gas inlet opening 224 is formed in a hard material such as sapphire, and is connected to the external gas supply source. Three gas inlet openings 224 are arranged in equiangular positions along a fourth concentric circle having the center O. It should be noted that the number of the gas inlet openings 224 is not limited to three. It is preferable that the gas inlet openings 224 be arranged symmetrically with respect the center O so as to achieve a well-balanced support of the gas bearing.

For example, if the gas bearing 200 has a cylindrical shape having a diameter of 30 mm and a height of 10 mm, the width k is preferably 1 mm and the depth d is preferably about 10 $\mu$m and a diameter of the gas inlet opening 224 is preferably in the range of 0.1 $\mu$m to 60 $\mu$m. A distance S between the contour of the bottom surface 20 and each of the T-shaped grooves 222 is preferably be as close to zero as possible since the bearing area of the gas bearing 200 is increased, which stabilizes the gas bearing 200 in a floating state.

When the three-point supporting arrangement is used as shown in FIG. 11, the amount of gas necessary for floating the gas bearing 200 together with the transfer arm 100 is reduced and less floating height fluctuation occurs as fluctuations in the load are applied to the gas bearing 200. The less the amount of gas for floatation, the less the possibility of loss of the negative pressure environment of the closed space C1. The floating height is reduced as the load applied to the gas bearing 200 is increased. However, the lesser fluctuation in the floating height with respect to the fluctuation in the load is preferable to facilitate the control of the floating height.

Referring to FIGS. 13 and 14, the transfer arm 63f has an elongated shape so that the semiconductor wafer W can be placed on the top side of one end thereof and three gas bearings 200 are mounted on the bottom side of the other end. The purpose of providing a plurality of gas bearings is to stabilize a position of the transfer arm 100. The number and the arrangement of the gas bearings 200 and the size and configuration of each of the gas bearings 200 may be changed in accordance with the configuration and structure of the transfer arm 63f.

It should be noted that each of the gas bearings 200 in a first set of three gas bearings has the same structure as the gas bearing 200 shown in FIG. 3, and the gas bearings 200 are arranged on corners of an equilateral triangle. A second set of three gas bearings 200 are provided in the closed space C2 so that each of the gas bearings 200 of the second set is opposite to the respective one of the gas bearings 200 of the first set mounted on the transfer arm 100.

More specifically, as shown in FIG. 14, a yoke 302 made of a magnetic material is provided between the transfer arm 63f and the gas bearings 200 in the closed space C1. Additionally, in the closed space C2, the gas bearings 200 are mounted to the moving part 330 via a yoke 304 and three permanent magnets that include magnets 306, 308, and a magnet behind magnet 306 (not shown in the figure), respectively. The yokes 302 and 304 and the magnets 306, 308, and the magnet behind magnet 306 (not shown in the figure) together constitute a closed loop magnetic circuit 300. As can be appreciated from FIG. 14, the permanent magnets 306 and 308 are positioned so that their polarities are opposite to each other. In FIG. 14, the permanent magnetic 306 is positioned so that the S-pole side faces the yoke 304 and the permanent magnet 308 is positioned so that the N-pole side faces the yoke 304. The polarity of the permanent magnet behind permanent magnet 306 (not shown in the figure) can be the same as either of the permanent magnets 306 and 308. In the above-mentioned structure, the transfer arm 63f and the moving part 330 are magnetically coupled by the magnetic circuit 300 in a non-contact manner.

The moving part 330 can perform, as a part of the drive unit 66 and/or the floating mechanism 68, a rotational movement, a rectilinear movement (one-dimensional movement) and a two-dimensional movement. Various known techniques can be applied to the moving part 330 to achieve the movement, and detailed descriptions thereof will be omitted. For example, a known X-Y stage disclosed in Japanese Laid-Open Patent Application No. 62-88528 may be used to achieve the two-dimensional movement of the moving part 330.

The magnetic circuit 300 according to the present embodiment has several functions. First, the magnetic circuit 300 can transmit a drive force generated by the moving part 330 to the transfer arm 63f since the magnetic circuit 300 magnetically couples the transfer arm 63f to the moving part 330. Accordingly, the movement of the wafer W can be controlled by controlling the movement of the moving part 330. Since the magnetic circuit 300 couples the transfer arm 63f and the moving part 330 in the non-contact manner, the closed space C1 can be separated from the closed space C2 by the separation wall 54.

The magnetic circuit 300 can control the floating height (amount of lift) of the transfer arm 63f so as to prevent the gas bearings 200 from being excessively lifted. The position of the wafer W can be controlled by controlling the floating height of the transfer arm 63f. Additionally, since there is no vibration generated due to movement of the transfer arm 63f, a stable movement of the transfer arm 63f can be achieved. Accordingly, the magnetic circuit 300 according to the present embodiment serves not as a means for lifting the transfer arm 63f but as a magnetic restraint means for magnetically restraining the transfer arm 63f from being excessively lifted.

Since the magnetic circuit 300 uses the permanent magnets 306, 308 and the magnet behind magnet 306 (not shown in the figure), the magnetic attracting force (restraining force) is not variable). Accordingly, in order to control the floating height of the transfer arm 63f, the amount of gas to be supplied to the gas bearings 200 is controlled. The control of the amount of gas to be supplied to the gas bearings 200 can be performed by a floating height control system which comprises: a floating amount detector 72 (not shown in the figure) for detecting the floating height of the transfer arm 63f; a flow sensor (not shown in the figure) for sensing the amount of gas supplied to the gas bearings 200; and a control circuit 70 for controlling the amount of gas to be supplied to the gas bearings 200 in accordance with outputs of the floating amount detector 72 and the flow sensor. The flow sensor and the control unit 70 can be integrated with each other. In such a structure, the control unit 70 controls the amount of gas to be supplied to the gas bearings 200 according to a feedback control so that the floating height of the transfer arm 63f detected by the floating amount detector 72 is maintained at a predetermined height. The control unit 70 may include a comparator, which comprises the output of the floating amount sensor 72 with a predetermined value.

Alternatively, the magnetic circuit 300 may use electromagnets instead of the permanent magnets 306, 308, and the magnet behind magnet 306 (not shown in the figure). In such a case, the floating height of the transfer arm 63f can be controlled by controlling current supplied to the electromagnets. The control by the magnetic circuit 300 and the control of the amount gas supplied to the gas bearings 200 may be selectively applied in accordance with the output of the floating amount detector 72. For example, if the transfer arm 63f does not float even when the current supplied to the magnetic circuit 300 is zero, it is difficult to control the height of the transfer arm 63f by the magnetic circuit alone.

The control by the magnetic circuit 300 can be performed by a floating height control system which comprises: the floating amount detector 72 (not shown in the figure) for detecting the floating height of the transfer arm 63f; a variable current source (not shown in the figure) for setting a current supplied to the coil; and a control circuit 70 (not shown in the figure) for controlling the amount of gas to be supplied to the gas bearings 200 in accordance with outputs of the floating amount detector 72. That is, the control unit 70 controls the magnetic restraining force according to a feedback control by controlling the current supplied by the variable current source so that the floating height of the transfer arm 63f detected by the floating amount detector 72 is maintained at a predetermined height. The control unit 70 may include a comparator, which compares the output of the floating amount detector 72 with a predetermined value.

If the magnetic circuit 300 comprises the yoke 302 and a guiding member (not shown in the figure) which is driven by a linear pulse motor provided in the closed space C2, the transfer arm 63f can be moved by moving the guiding member. In such a case, the magnetic circuit 300 can drive the transfer arm 62f in an indirect manner, that is, the non-contact manner.

The magnetic circuit 300 can be provided in the closed space C1 so as to drive the transfer arm 63f in a direct manner. Such an arrangement may be preferable in a case in which a simple motion such as, for example, a rotation is required for the transfer arm 63f. Such a structure is obvious to persons skilled in the art from the disclosure of this specification, and a detailed description will be omitted.

Figure 15:
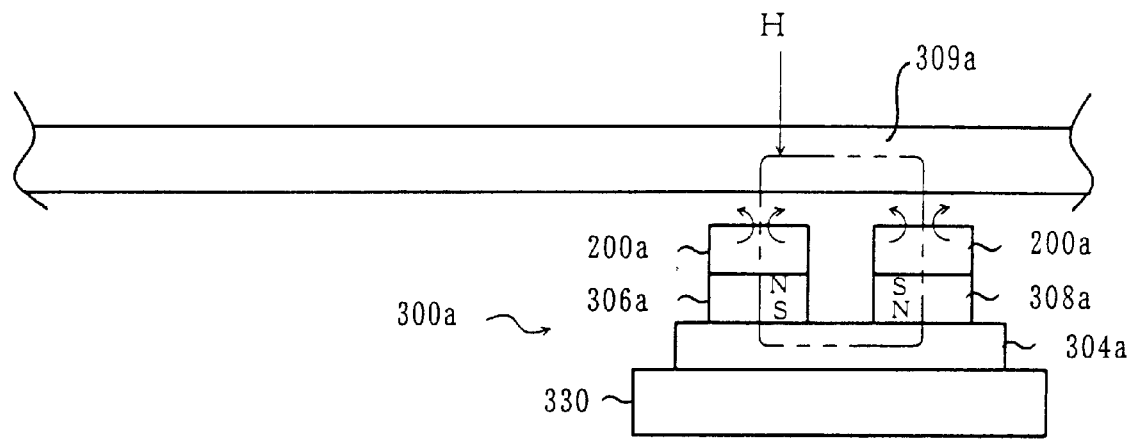
FIG. 15 is an illustration of gas bearings incorporated in the magnetic restraining arrangement.

It should be noted that although the yoke 302 and the yoke 304 are located in the different spaces C1 and C2, respectively, by the provision of the separation wall 54 between the yokes 302 and 304, the separation wall 54 is not necessary for the magnetic restraining arrangement. FIG. 15 shows gas bearings 200a incorporated in the magnetic restraining arrangement. Each of the gas bearings 200a has the same structure as the gas bearing 200. The magnetic restraining arrangement comprises the gas bearings 200a, a yoke 304a, a magnetic field generating parts 306a and 308a and a gas bearing guide 309a made of a magnetic material. In the magnetic restraining arrangement shown in FIG. 15, a closed loop magnetic circuit H is formed as indicated by a dotted line. The gas bearings 200a can be used in the position as indicated in FIG. 15 or positioned upside down.

In the present embodiment, the drive unit 66 and/or the floating mechanism 68 drives the robot 61 by a magnetic means. However, the robot 61 may be driven by other means such as a mechanical means, an electric means, an optical means or a superconductive means or a combination of aforementioned.

In operation, when the drive unit 66 and/or the floating mechanism 68 drives the robot 61, the robot 61 moves and/or rotates in a desired direction along the opposing surface OP. If the robot 61 carries the wafer W, the wafer W is also moved and/or rotated together with the robot 61. Since the gas bearings 200 are used, the robot 61 can be moved and/or rotated at a high speed without friction and vibration. The motion of the robot 61 may include one-dimensional motion, two-dimensional motion and three-dimensional motion. Additionally, the part of the transfer apparatus carrying the wafer W does not vibrate. Further, since there is no friction such as a static friction, the robot 61 can achieve a quick response when starting and stopping.

If a mechanical bearing such as a ball bearing or a roller bearing is used to movably support the movable element on the opposing surface OP, a vibration is generated due to friction. The vibration may increase when the movable element moves at a high speed, which may result in an offset in the position of the movable element. However, the transfer apparatus 60 according to the present embodiment eliminates such a problems.

The control unit 70 can be mounted to the robot 61 so that the robot 61 recognizes an obstacle to avoid a collision with the obstacle. In such a case, the control unit 70 may include a CCD sensor and/or a distance detecting sensor. Additionally, the control unit 70 may remote control the robot 61 by a radio frequency. In such a case, the control unit 70 may use a transceiver or the like.

The transfer module 50 of the cluster system 100 shown in FIG. 1 can be easily expanded to the system shown in FIG. 2. The transfer module 50A shown in FIG. 2 comprises four transfer modules 50 connected to each other. It should be noted that the number of transfer modules 50 added to the cluster system 100 of FIG. 1 is not limited to two as shown in FIG. 2. However, the transfer module 50A shown in FIG. 2 has only one transfer apparatus 60. The transfer module 50 of the present embodiment is configured to have a rectangular or square cross section. It should be noted that a triangular shape or other shapes may be used for the transfer module 50. Additionally, in FIG. 2, the number of load ports 10 and the number of the load lock modules 40 are increased, the increased numbers are not limited to that shown in FIG. 2.

As mentioned above, since the configuration of the transfer module 50 is simplified as compared to the conventional transfer module, the transfer module according to the present embodiment can be easily produced and a production cost is reduced. Additionally, as shown in FIG. 1, the transfer module 50 can be connected to a small number of process modules with a small installation area. Thus, this system is advantageous for a user requiring a small number of process modules 80 since the initial investment can be small and the installation area can also be small. Additionally, the transfer module 50 has an improved expandability over the conventional system, and enables stepwise investment. For example, the conventional cluster system including the transfer module having an octagonal shape can be provided with eight process modules 80 at maximum. On the other hand, it can be appreciated that an arbitrary number of process modules 80 can be connected to the transfer module 50 according to the present embodiment. That is, the number of the process modules connectable to the transfer module 50 is not limited by the shape of the transfer module 50.

Additionally, as mentioned above, since the transfer apparatus 60 is not fixed to the opposing surface OP of the housing 52, the transfer module can access each of the process modules 80 by moving along the indefinite track within the transfer module 50 even if the number of the process modules 80 is increased as shown in FIG. 2. Accordingly, the single transfer apparatus 60 can associate with all of the transfer modules 50 and the process modules 80, which contributes to the reduction in the system cost. It should be noted that a plurality of transfer apparatuses 60 may be provided if required.

Referring to FIG. 3, the housing 52 is configured so that a side wall having an opening 53a and a side wall 52C having no opening are freely mountable. Additionally, in FIG. 9, the housing 52 may be configured so that a side wall 52D having an opening 53b and a side wall 52E having no opening are freely mountable. Accordingly, the housing 52 can be constituted by using the side wall 52B having the opening 53a or the side wall and 52D having the opening 53b on the side where the process module 80 is connected and using the side wall 52C having no opening or the side wall 52E having no opening on the side where the process chamber 80 is not connected. It should be noted that when the transfer modules 50 are connected as the transfer module 50A shown in FIG. 2, the opposing surfaces OP of the transfer modules 50 must be at the same level.

Figure 16:
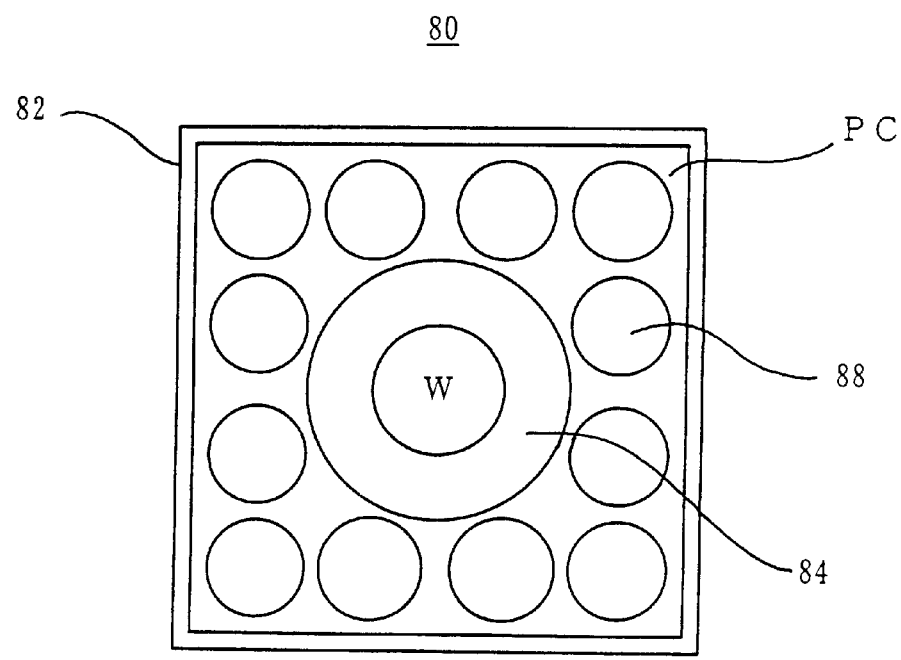
FIG. 16 is a schematic plan view of the process module shown in FIGS. 1 and 2.
Figure 17:
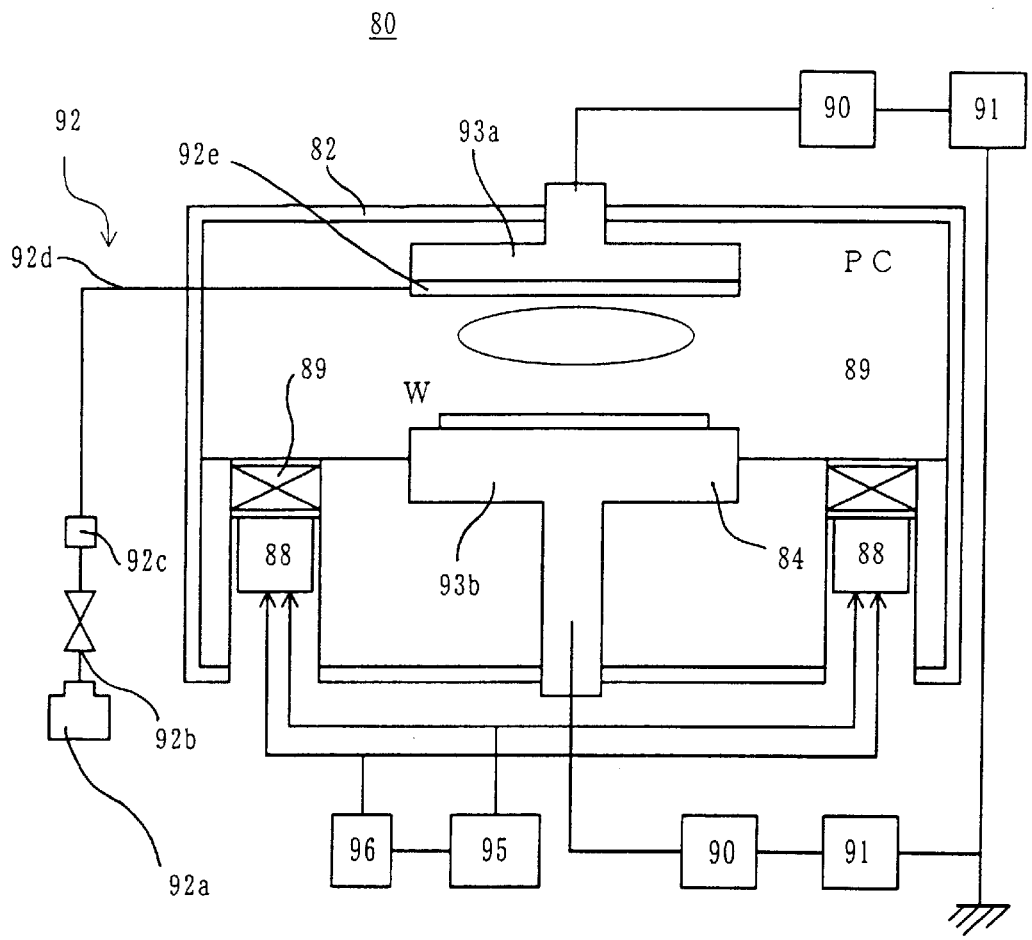
FIG. 17 is an illustration of the entire structure of the process module shown in FIGS. 1 and 2.

A description will now be given, with reference to FIGS. 16 and 17, of the process module 80. FIG. 16 is a schematic plan view of the process module 80. FIG. 17 is a schematic illustration of the entire structure of the process module 80. In the present embodiment, the process module 80 is a parallel flat plate type process apparatus such as a plasma CVD apparatus or a plasma etcher. However, the process module 80 is not limited to such an apparatus, and a microwave plasma process apparatus may be used.

The process module 80 comprises a housing 82, a susceptor 84, a plurality of nude type turbo molecular pumps 88, pressure adjust valves 89, a high-frequency power source 90, a pulse oscillator 91, a reaction gas supply system 92 and a pair of electrodes 93a and 93b. Preferably, the process module 80 further comprises a control unit 95 that controls the turbo molecular pumps 88 and a sensor 96 detecting a revolution speed of each of the turbo molecular pumps 88. Although in the present embodiment twelve turbo molecular pumps 88 are provided to the process module 80, the number of the turbo molecular pumps 88 is not limited to twelve. Additionally, other high-vacuum pumps may be used instead of the turbomolecular pumps 88.

The housing 82 has side walls and a bottom wall formed of a conductive material such as an aluminum plate so as to define a process chamber PC. The housing 82 has a rectangular cross section. The process chamber PC is maintained at a predetermined negative pressure by the turbo molecular pumps 88. The susceptor 84 is situated inside the housing 82 so that the wafer W is placed thereon. In FIG. 17, an electrostatic chuck and a clamping mechanism for fixing the wafer W are eliminated for the sake of simplification of the figure.

The susceptor 84 is integrally formed with the electrode 93b. The susceptor 84 controls a temperature of the wafer W within the process chamber PC. For example, is a plasma CVD process is performed, the temperature of the wafer W is maintained in the range of 350° C. to 550° C. If an etching process is performed, the temperature of the wafer W is maintained lower than 200° C. Various known temperature control methods can be used for controlling the temperature of the wafer W. The susceptor 84 may be provided with a baffle plate (or rectifying plate) which separates a process space where the wafer W is located from an exhaust space under the process space so as to maintain the process space at a predetermined potential and also maintain a predetermined negative pressure (for example, 50 mToor) in the process space. The baffle plate may be formed of an aluminum disc having a thickness of 2 mm. The baffle plate has many through holes having a diameter of about 2 mm in a regular arrangement so that the opening ratio of the baffle plate is more than 50%. If necessary, the baffle plate may be provided with a function to prevent a reverse flow of the gas from the exhaust space to the process space.

In the present embodiment, the nude type turbo molecular pump 88, which is a kind of high-vacuum pumps, is used as an evacuating pump, which evacuates gas in the process chamber PC. The turbo molecular pumps 88 are connected to the process chamber PC via the respective pressure adjust valves 89. Each of the pressure adjust valves 89 can be a known valve such as a conductance valve, a gate valve or a high-vacuum valve. The pressure adjust valves 89 are closed when not in operation. The pressure adjust valves 89 are opened, when in operation, so as to maintain the process chamber PC at a predetermined pressure (for example, in the rage of 0.1 mToor to 200 mTorr) generated by the turbo molecular pumps 88.

The turbo molecular pump (TMP) is a high-vacuum pump having stationary blades and rotational blades arranged in an alternate manner. The rotational blades have slits angled opposite to that of the stationary blades. The rotational blades rotate at a high speed so as to evacuate gas molecules in the axial direction. In the present embodiment, the nude type turbo molecular pump 88 is used so as to reduce a conductance loss between the area t be evacuated and the pump by omitting a casing and mounting the pump 88 as shown in FIG. 18.

Figure 18:
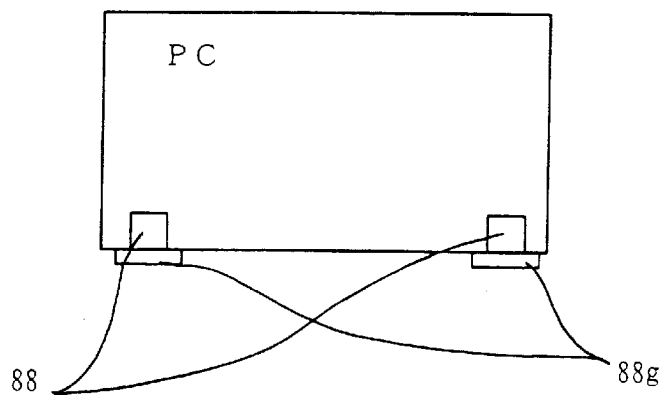
FIG. 18 is schematic illustration of the process chamber for showing the connection of the pumps to the process chamber.

FIG. 18 is schematic illustration of the process chamber PC for showing the connection of the pumps 88 to the process chamber PC. According to the arrangement of the pumps 88 shown in FIG. 18, the pumps 88 protrudes into the process chamber PC, thereby reducing the distance between the area to be evacuated and each of the pumps 88. Thus, the efficiency of the evacuation is increased. The nude type turbo molecular pumps 88 are used to maintain the process chamber PC at a pressure in the range of 0.1 mTorr to 200 mTorr.

Figure 19:
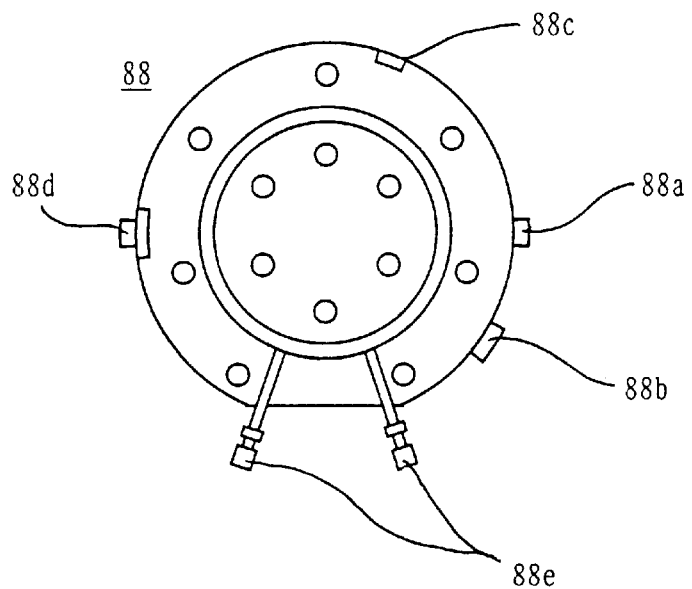
FIG. 19 is a schematic plan view of a nude type turbo molecular pump.
Figure 20:
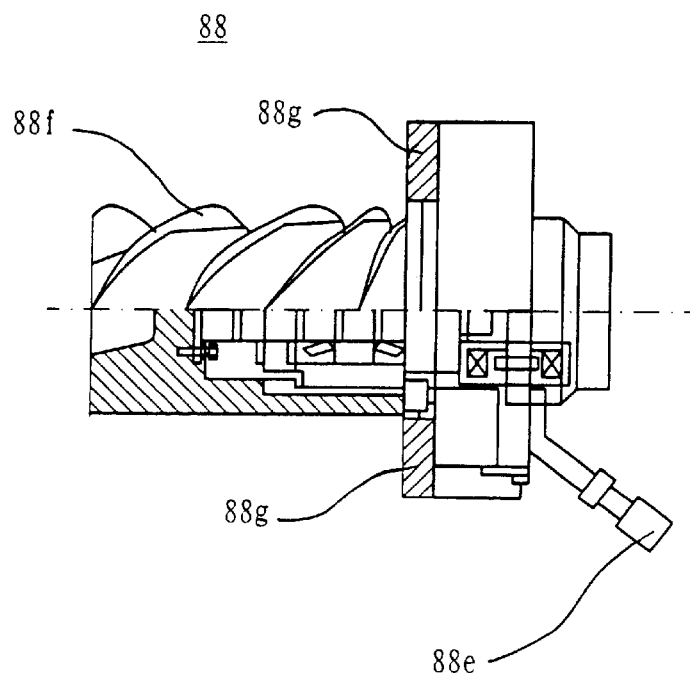
FIG. 20 is a cross-sectional view of the nude type turbo molecular pump.

FIG. 19 is a schematic plan view of the nude type turbo molecular pump 88. FIG. 20 is a cross-sectional view of the nude type turbo molecular pump 88. The nude type turbo molecular pump 88 generally comprises: a power connector 88a connected to a power source (not shown in the figure); a control connector 88b connected to the control unit 95; an $N_2$ purge ports 88c and 88d; a cooling water pipe 88e; rotational blades 88f; and a mounting flange 88g.

Although the conventional apparatus uses a single turbo molecular pump, the process apparatus according to the present embodiment uses twelve nude type turbo molecular pumps 88. Accordingly, the vacuum pump provided to the conventional process apparatus has an evacuation capability of about 1,600 l/s (litters per second), whereas each of the nude type turbo molecular pumps 88 provided in the present embodiment has an evacuation capability of about 133 l/s (1600/12), and preferably has an evacuation capability of $(1600/12)^{1+\alpha}>(1600/11)$ l/s, where $\alpha$ is a constant determined by an installation environment. Additionally, the weight of each of the nude type turbo molecular pumps 88 is about 10 to 15 kg, while the weight of the conventional turbo molecular pump is about 100 kg.

The nude type turbo molecular pump 88 has several advantages. First, each of the nude type turbo molecular pumps 88 can be located in a portion of the housing which portion is not used. The conventional turbo molecular pump is mounted to a side wall or a bottom wall of a housing of the process module. Such a structure requires a large mounting space, which results in an inefficient use of the space. On the other hand, the nude type turbo molecular pump 88 is small, thereby preventing an increase in the installation space by efficient use of unoccupied portions of the process chamber PC. It should be noted that the arrangement of the nude-type turbo molecular pumps 88 shown in FIG. 16 is merely an example. However, if a uniform evacuation is required, the pumps 88 are preferably positioned in a symmetric arrangement as shown in FIG. 16.

Second, the nude type turbo molecular pump 88 can generate uniform plasma as indicated by an oval line in FIG. 17. The conventional turbo molecular pump may generate an uneven evacuation since evacuation is performed from a single direction. Accordingly, if the process module is a plasma process apparatus, unevenness occurs in the plasma density. Thus, there is a problem in that a high-quality plasma process cannot be performed due to the partial unevenness of the process of the wafer W. On the other hand, the nude type turbo molecular pumps 88 can be mounted to the bottom wall of the housing 82 in a symmetric arrangement, a uniform plasma can be generated, which results in a high-quality plasma process.

Third, maintenance operation of the nude type turbo molecular pump 88 is easy. The conventional turbo molecular pump has a large weight of about 100 kg which greatly exceeds 51 pounds (about 23 kg) which is defined as a weight which can be handled by a single person for maintenance operation in view of safety defined in the human technology standards, SEMI-S, chapter eleven. At least five persons are required to satisfy the requirement defined in the standard SEMI-S. Additionally, since the conventional turbo molecular pump has a cylindrical outer configuration, a complex jig must be mounted to the pump so that an equal load can be applied to the five persons. Further, since a replacement operation or a maintenance operation takes a long time, the stop period of the process module becomes long, and a net working rate becomes low. On the other hand, since the weight of each of the nude type turbo molecular pumps 88 is in the range of 10 to 15 kg, the replacement operation and the maintenance operation can be performed by a single person. Additionally, there is no need to use a jig to handle the pump. Further, since the replacement operation and the maintenance operation can be performed in a short time, the stop period of the process module 80 is efficiently short and a decrease in the net working rate can be prevented.

Preferably, in the present embodiment, if one of the nude type turbo molecular pumps 88 is failed, the reset of the pumps 88 can be operated with a slightly higher evacuation capability so as to compensate for the failed pump. In order to achieve such a scheme, each of the nude type turbo molecular pumps 88 must have an evacuation capability of $(1600/12)^{1+\alpha}$. In the present embodiment, the rest of the pumps 88 can create the required negative pressure environment, and the replacement and maintenance operation can be performed when the process module is not in operation. This also reduces the stop time of the system. In such a case, the control unit 95 of the process module 80 detects a rotation speed of the rotational blade of each of the pumps 88. If the control unit 95 detects a failure in one of the pumps 88, the control unit 95 increases the evacuation capability of the rest of the eleven pumps 88.

More preferably, the failed pump 88 can be removed from the process module 80 while the process module is in operation so as to replace the failed pump. Since there is less possibility that a plurality of pumps 88 fail at the same time, the stop period of the system in the present embodiment can be reduced to substantially zero. In such a case, the process module 80 may further comprise: valves 89 which open and close passages between the respective pumps 88 and the process chamber PC; sensors for detecting the connection of the respective pumps 88 to the process module 80; and an automatic pressure control unit (APC).

When the control unit 95 detects a failed pump 88 via one of the sensors 96, the control unit 95 closes one of the valves 89 corresponding to the failed pump 88 so as to close the passage between the failed pump 88 and the process chamber PC. Accordingly, the negative pressure environment can be maintained when the failed pump 88 is removed from the housing 82 of the process module 80. At this time, the evacuation capability of the rest of eth pumps 88 is increased. Thereafter, the failed pump 88 is repaired or replaced, and the normal pump 88 is mounted to the housing 82. The connection of the normal pump 88 is detected by the corresponding one of the sensors, and the control unit 95 opens the valve 89 and returns the evacuation capability of the rest of the pumps 88 so that the evacuation is resumed by the twelve pumps 88.

Additionally, since the conventional turbo molecular pump costs about several million yen and its size is vary large, it is inconvenient for a user to purchase the conventional one and stores it for future use, and the user generally orders the conventional pump after the pump has failed. Accordingly, the user must wait until the ordered pump arrives, which results in a long stop period. However, the nude type turbo molecular pump 88 according to the present embodiment is small and relatively inexpensive, the user can conveniently keep a spare pump 88, thereby reducing the stop period of the system.

Fourth, the nude type turbo molecular pump 88 has higher safety than the conventional pump. The conventional pump has a very large angular moment, for example, about 4 ton m. However, the operating energy of the nude type turbo molecular pump 88 is about one twelfth of that of the conventional pump.

Figure 21:
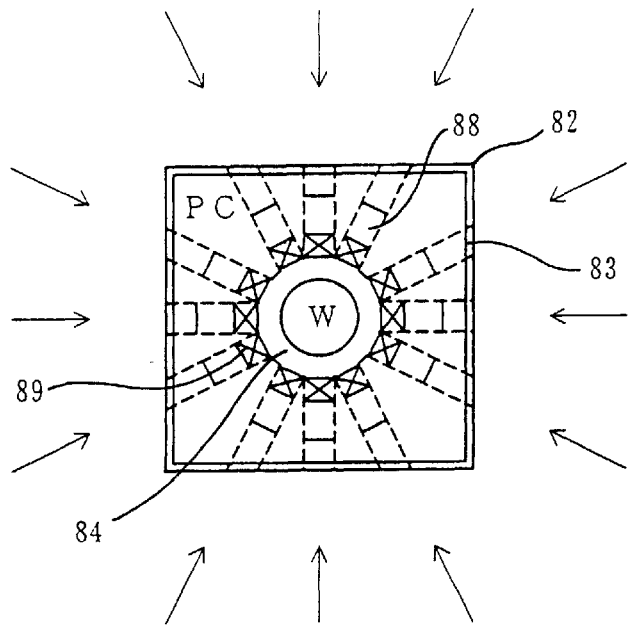
FIG. 21 is an illustration of the housing of the process module viewed from above.

The nude type turbo molecular pumps 88 are inserted into respective openings formed in the unoccupied portions as shown in FIG. 17. Alternatively, the pumps 88 may be circumferentially arranged as shown in FIG. 21 so that each of the pumps is positioned along a radial direction. FIG. 21 is an illustration of the housing 82 viewed from above. In this case, the twelve connection openings 83 are formed in the side wall of the housing 82 at the same height in a symmetric arrangement.

It should be noted that if a fore pump or roughing pump is required in addition to the nude type turbo molecular pumps 88, the fore pump can be commonly connected to all or a part of the pumps 88. Additionally, in this connection, the cluster system 100 can commonly connect a power source to a plurality of members.

The high-frequency power source 90 applies a high-frequency electric power having a frequency of 13.56 MHz to the circular plate electrodes 93a and 93b.

A gas supply nozzle 92e of a reaction gas supply system 92 is provided to the side wall of the housing 82. the gas supply nozzle 92e is connected to a reaction gas source 92a via a mass flow controller 92c and a stop valve 92b. For example, in order to deposit a silicon nitride film, a predetermined mixture gas mixed with $NH_3$ or $SiH_4$ can be selected as a reaction gas. The predetermined gas contains one of neon, xenon, argon, helium, radon and krypton and $N_2$ and $H_2$.

A description will now be given, with reference to FIGS. 3 and 4, of a method for adjusting pressures in the transfer chamber TC, the process chamber PC and the closed space C2 when the transfer arm 63 and the end effecter 64 transfers the wafer W from the transfer chamber TC to the process chamber PC. The transfer chamber (C1) and the closed space C2 are connected to each other via the opening 55 provided in the separation wall 54. The pressure adjusting mechanism comprises: a gas supply apparatus 86 connected to the process chamber PC; the nude type turbo molecular pumps 88; the gas supply apparatus 56 connected to the transfer chamber TC; and an exhaust apparatus 58 connected to the closed space C2. These gas supply and exhaust apparatuses can be controlled by the control unit 95 and/or the control unit 70, or alternatively controlled by one or more separate control units. Additionally, when the gas bearings 200 are used, a gas supply apparatus for supplying a gas to the gas bearings 200 may be provided. In such a case, the gas supply apparatus supplies a gas at a pressure sufficient for lifting the gas bearings 200, and a constant pressure control may be performed.

The gas supply apparatus 56 supplies an appropriate amount of gas so as to maintain a normal and desired flow in the transfer chamber TC in accordance with a constant flow control. The exhaust apparatus 58 exhausts the gas supplied by the gas supply apparatus 56 so as to maintain a predetermined negative pressure. The exhaust apparatus 58 is controlled so that the pressures in the closed spaces C1 and C2 are substantially equal to each other.

With respect to the control of gas flow, a control is made to always generate a flow stream from the closed space C1 to the closed space C2. Additionally, a flow stream is generated always from the transfer chamber TC to the process chamber PC. The reason for such an arrangement is to prevent undesired leakage of a gas from the process chamber PC to the transfer chamber TC.

Figure 22A:
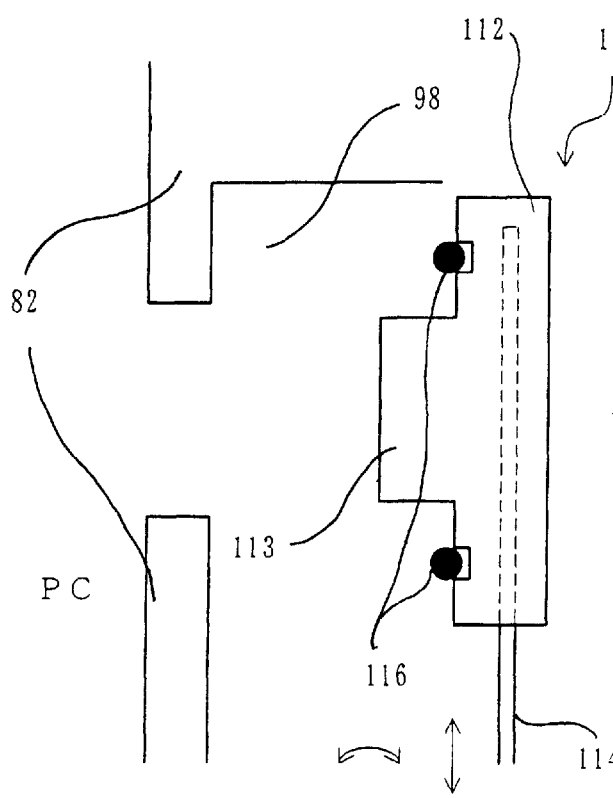
FIG. 22A is an illustration of a gate valve in an open state.
Figure 22B:
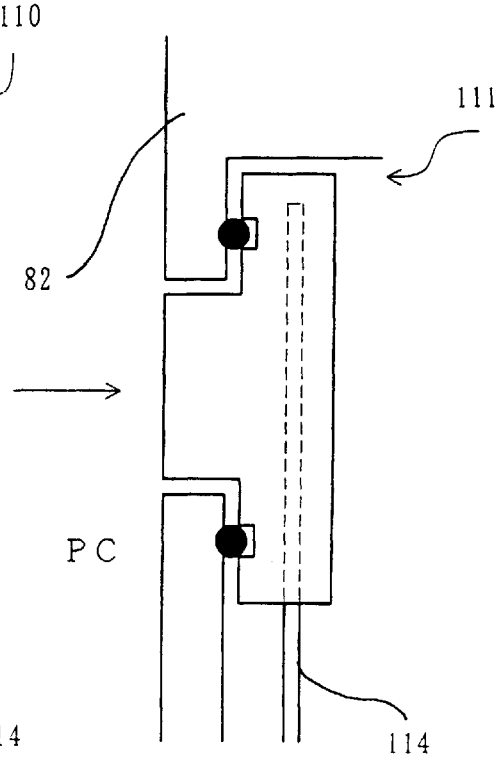
FIG. 22B is an illustration of the gate valve in a closed state.
Figure 23:
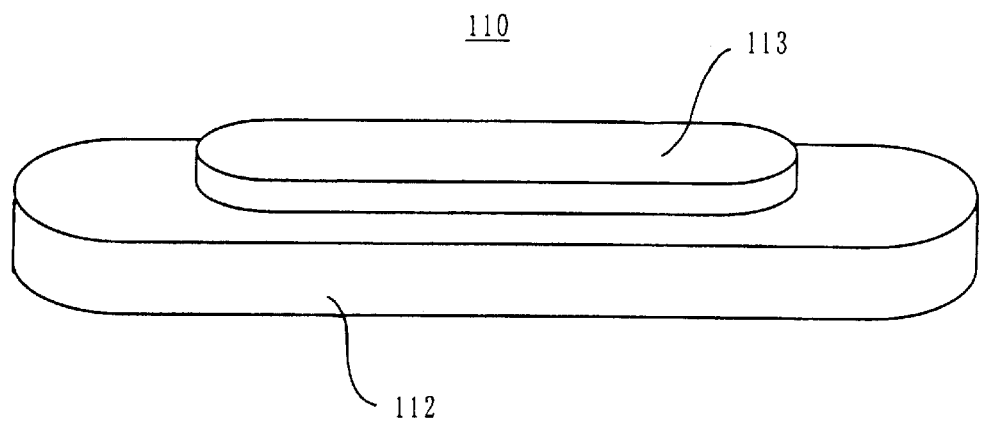
FIG. 23 is a perspective view of a valve body of the gate valve.

A description will now be given, with reference to FIGS. 22A, 22B and 23, of a gate valve applicable to the process module 80. FIG. 22A is an illustration of the gate valve 110 in an open state. FIG. 22B is an illustration of the gate valve 110 in a closed state. FIG. 23 is a perspective view of a valve body 112 of the gate valve 110.

The gate valve 110 according to the present embodiment is a so-called insert type gate valve. The gate valve 110 comprises: a valve body or valve plate 112 engageable with a connection groove 98 which is connected to the transfer module 50 formed in the housing 82; a protruding portion 113; a drive shaft 114; and an O-ring 116. The protruding portion 113 is engageable with the groove 98. The drive shaft 114 rotates and moves the valve body 112 so as to bring the valve body into engagement with the groove 98 as indicated by arrows in FIG. 22A. The O-ring 116 seals the opening of the housing 82.

Conventionally, the valve body 112 is not provided with the protruding portion 113. Accordingly, plasma may enter the groove 98, which generates unevenness of the plasma. As a result, there is a problem that a high-quality plasma process cannot be achieved. Additionally, there is a problem in that a secondary product produced in the plasma process sticks to the inner wall of the groove 98. However, such a problem does not occur in the present embodiment since the valve body 112 according to the present invention has the protruding portion 113 so as to close the groove 98.

Figure 24A:
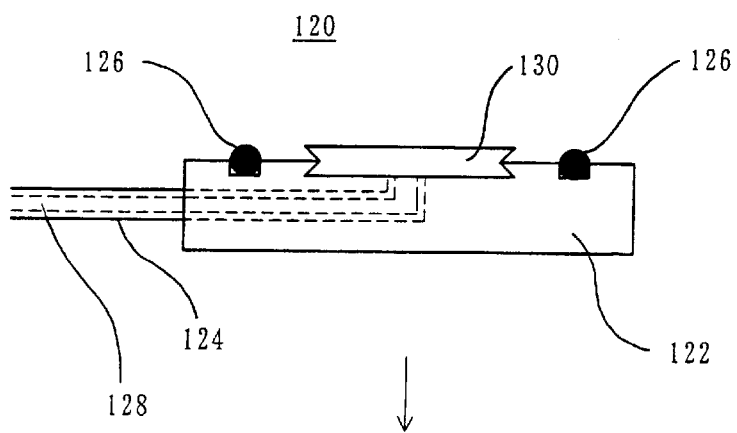
FIG. 24A is an illustration of a part of a variation of the gate valve in a state in which a bellows is contracted.
Figure 24B:
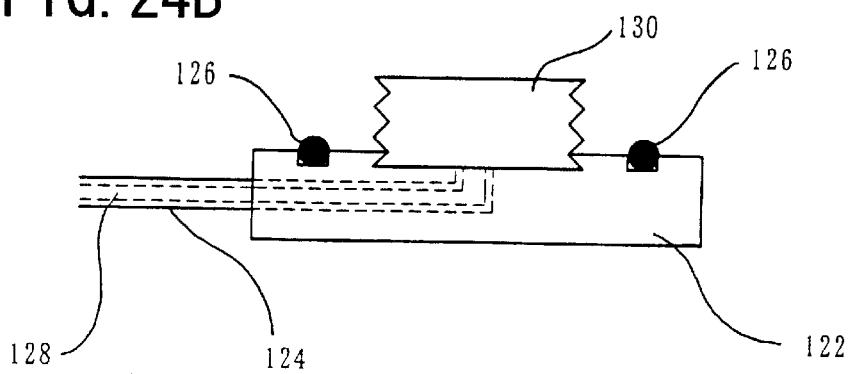
FIG. 24B is an illustration of the part of the variation of the gate valve in a state in which the bellows is expanded.

FIG. 24A is an illustration of a part of a variation of the gate valve in a state in which a bellows is contracted. FIG. 24B is an illustration of the part of the variation of the gate valve in a state in which the bellows is expanded. The gate valve 120 comprises a valve body 122, a drive shaft 124, an O-ring 126, an air supply tube 128 and a bellows 130. The drive shaft 124 is made hollow so as to accommodate the air supply tube 128 therein. Alternatively, an air supply passage serving as the air supply tube may be formed in the drive shaft 124. The bellows 130 expands as shown in FIG. 24B when air or inert gas is supplied thereto via the air supply tube 128 so as to provide the function of the protruding portion 113 shown in FIGS. 22A and 22B.

The O-rings 116 or 126 are generally made of rubber or resin. The housing is made of a conductive material such as aluminum. The surface of the housing 82 is anodized, and covered by an alumina ($Al_2O_3$) film. Thus, the surface of the housing 82 is insulated by the alumina film. However, The valve body 112 or 122 is electrically floated above the housing by the O-ring 116 or 126 which may be made of plastics such as elastomer. Accordingly, when the valve body 112 or 122 is exposed to plasma and electrons or ions enters the surface of the valve body 112 or 122, the potential of the surface of the valve body 112 or 122 is raised, which may cause an electric discharge between the housing 82 and the valve body 112 or 122. If such an electric discharge occurs, the alumina film is partially damaged and the base aluminum is exposed. Accordingly, the electric discharge further continues at the exposed portion and expands to the periphery of the exposed portion. As a result, the plasma process becomes unstable, and a high-quality process cannot be achieved.

In the present embodiment, the above-mentioned problem is eliminated by: 1) short-circuiting the drive shaft 114 or 124 to the housing 82; 2) short-circuiting an end 111 of the valve body 112 to the side wall; 3) applying a bias voltage to the valve body 112 or 122; and/or 4) making the O-ring 116 or 126 by a conductive material or covering O-ring 116 or 126 by a conductive material. As a result, a high-quality plasma process can be performed in the process chamber PC. It should be noted that a general structure and operation of the insertion type gate valve is known in the art by a commercially available vacuum gate valve, and detailed descriptions thereof will be omitted.

A description will now be given of an operation of the cluster system 100 according to the present embodiment. First, the ME pod is transferred by the AGV or OHT, and is placed in the load port 10. Then, a transfer apparatus (not shown in the figure) in the loader module 30 receives the wafer W from the load port 10, and the orienter 20 adjust the position of the wafer W by referring to the orientation flat or the notch formed on the wafer W. Thereafter, the transfer apparatus of the loader module 30 transfer the wafer W to the load lock module 40.

The wafer W in the load lock module 40 is transferred to the process module 80 by the transfer apparatus 60 of the transfer module 50. Preferably, the load lock module has a preheating unit so as to heat the wafer W to a temperature of approximately 450° C. before transferring the wafer W to the process module 80. The wafer W is introduced into the process chamber PC via the gate valve 110 or 120, and is placed on the susceptor 84. Thereafter, the transfer apparatus 60 moves to the home position if necessary.

Then, the wafer W in the process module 80 is heated to a temperature of 450° C. by the susceptor so as to perform a plasma process. If the wafer is preheated as mentioned above, the time period for preparing the plasma process is reduced. Thereafter, the nude type turbo molecular pumps 88 reduce the pressure in the process chamber PC to a negative pressure such as 50 mTorr, and maintain the negative pressure. Since the nude type turbo molecular pumps 88 are positioned on the bottom of the process chamber PC in a symmetric arrangement, a uniform evacuation can be achieved. Then, a reaction gas is introduced into the process chamber PC from the nozzle 92e. The reaction gas is supplied from the reaction gas source 92a via the mass flow controller 92c and the stop valve 92b while the flow of the reaction gas is controlled. The reaction gas may be a mixture gas of helium, nitrogen and hydrogen, and $NH_3$ is added to the mixture gas.

The process space in the process chamber PC is controlled to be the temperature of 450° C. At the same time a high-frequency electric power is introduced into the electrodes 93a and 93b from the high-frequency power source 90. As a result, the high-frequency wave can be introduced into the process chamber evenly (that is, without localization) with a desired density. The high-frequency wave converts the reaction gas into plasma so as to achieve a plasma CVD process. The plasma CVD process continues for a predetermined period, and, then, the wafer W is taken out of the process chamber PC via the gate valve 110 or 120 by the transfer apparatus 60 of the cluster system 100. The wafer W taken out of the process module 80 is transferred to the load lock module 40. The load lock module preferably has a precooling unit so cool the wafer W to a room temperature in a short time. Thereafter, if necessary, the transfer apparatus 60 transfers the wafer W to a next stage process module 80 such as an ion implantation apparatus.

The present invention is not limited to the specifically disclosed embodiments, and variations and modifications may be made without departing from the scope of the present invention.

The present invention is based on Japanese priority application No. 11-173318 filed on Jun. 18, 1999, the entire contents of which are hereby incorporated by reference.

What is claimed is:

1. A transfer module for transferring an object to be processed between a transfer chamber and at least one process chamber connected to the transfer chamber, the transfer module comprising:
    a housing defining the transfer chamber, the housing being constructed and arranged so that a plurality of such housings are connectable to each other;
    a movable part constructed and arranged to be tracklessly movable about a base surface provided in the housing so that the movable part is tracklessly movable within the transfer chamber;
    a transfer part attached to the movable part, the transfer part being constructed and arranged to hold the object to be processed and being movable between the transfer chamber and the process chamber;
    a trackless drive mechanism driving the movable part; and
    a control unit controlling trackless motion of the movable part.

2. The transfer module as claimed in claim 1, wherein a plurality of the housings are connected to each other so that the housings together define the transfer chamber;

a plurality of the process chambers are connected to the transfer chamber;

the movable part is movable over the base surfaces of the plurality of the housings; and the transfer part is movable between the transfer chamber and each of the process chambers.

3. The transfer module as claimed in claim 1, further comprising a floating mechanism which floats the movable part above the base surface of the housing.

4. The transfer module as claimed in claim 3, wherein the control unit controls the floating mechanism so as to adjust a floating height of the movable part above the base surface.

5. The transfer module as claimed in claim 1, further comprising a pressure adjust mechanism which adjusts a pressure in the housing so as to maintain the housing in a predetermined negative pressure environment.

6. The transfer module as claimed in claim 1, wherein the object to be processed is a semiconductor wafer.

7. The transfer module as claimed in claim 1, wherein the object to be processed is an LCD glass substrate.

8. The transfer module as claimed in claim 1, wherein the transfer part includes a nonarticulated arm.

9. The transfer module as claimed in claim 1, wherein the transfer part includes an articulated arm having at least one articulation.

10. The transfer module as claimed in claim 1, wherein the movable part is movable toward the process chamber.

11. The transfer module as claimed in claim 1, wherein the movable part is movable in a direction parallel to the base surface of the housing.

12. The transfer module as claimed in claim 1, wherein said floating mechanism includes a gas bearing which supplies a gas between said movable part and said base surface so as to float said movable part above said base surface by a pressure of the gas.

13. The transfer module as claimed in claim 1, wherein said drive mechanism comprises:

a moving part which is movable located outside a space in which said movable part is located; and a coupling mechanism which couples said movable part to said moving part in a noncontact manner.

14. The transfer module as claimed in claim 13, wherein said coupling mechanism comprises:

a first yoke connected to said movable part;

second yoke connected to said moving part; and a magnet provided between said movable part and said moving part.

15. The transfer module as claimed in claim 1, wherein said drive mechanism includes a battery incorporated in said movable part.

16. The transfer module as claimed in claim 1, wherein said drive mechanism includes a noncontact power supply apparatus which supplies power to said movable part.

17. The transfer module as claimed in claim 16, wherein said noncontact power supply apparatus comprises:

a transmitting unit which transmits a radio wave from outside of said housing; and an antenna and a power supply circuit which are incorporated in said movable part, wherein the radio wave transmitted from said transmitting unit is received by said antenna and said power supply circuit generates an induced electromotive force by electromagnetic induction.

18. The transfer module as claimed in claim 16, wherein said noncontact power supply apparatus comprises:

a light source which emits light beam from outside of said housing, and a light-receiving element and an optoelectric conversion circuit which are incorporated in said movable part.

19. A cluster system comprising:

at least one process module defining a process chamber, the process module being constructed and arranged to apply a predetermined process to an object to be processed in the process chamber;

at least one load lock module defining a load lock chamber, the load lock chamber having a substantially rectangular cross section; and a transfer module defining a transfer chamber, the transfer module transferring the object between the transfer chamber and each of the process chamber and the load lock chamber, wherein the transfer module comprises:

a housing defining the transfer chamber, the housing being constructed and arranged so that a plurality of the housings are connectable to each other;

a movable part constructed and arranged to be tracklessly movable along a base surface provided in the housing so that the movable part is tracklessly movable within the transfer chamber;

a transfer part provided on the movable part, the transfer part holding the object to be processed and being movable between the transfer chamber and the process chamber;

a trackless drive mechanism driving the movable part; and a control unit controlling motion of the movable part.

20. The cluster system as claimed in claim 19, wherein a plurality of the housings are connected to each other so that the housings together define the transfer chamber;

a plurality of the process chambers are connected to the transfer chamber;

the movable part is movable over the base surfaces of the plurality of the housings; and the transfer part is movable between the transfer chamber and each of the process chambers.

\* \* \* \* \*